United States Patent
Farjadrad et al.

(10) Patent No.: US 10,063,341 B1
(45) Date of Patent: Aug. 28, 2018

(54) FLEXIBLE DATA TRANSMISSION SCHEME ADAPTIVE TO COMMUNICATION CHANNEL QUALITY

(71) Applicant: Aquantia Corporation, Milpitas, CA (US)

(72) Inventors: Ramin Farjadrad, Los Altos, CA (US);
Paul Langner, Fremont, CA (US);
Hossein Sedarat, San Jose, CA (US);
Ramin Shirani, Morgan Hill, CA (US);
Kamal Dalmia, Fremont, CA (US)

(73) Assignee: Aquantia Corp., Milpitas, CA (US)

( * ) Notice: Subject to any disclaimer, the term of this patent is extended or adjusted under 35 U.S.C. 154(b) by 0 days.

(21) Appl. No.: 15/175,516

(22) Filed: Jun. 7, 2016

Related U.S. Application Data

(63) Continuation of application No. 14/504,318, filed on Oct. 1, 2014, now Pat. No. 9,363,039, which is a
(Continued)

(51) Int. Cl.
*H04L 1/00* (2006.01)
*H04L 12/811* (2013.01)
(Continued)

(52) U.S. Cl.
CPC ............ *H04L 1/0005* (2013.01); *G06F 11/10* (2013.01); *H03M 13/1102* (2013.01);
(Continued)

(58) Field of Classification Search
CPC ... H04L 1/0041; H04L 1/0057; H04L 1/0045; H04L 1/0005; H04L 1/0033;
(Continued)

(56) References Cited

U.S. PATENT DOCUMENTS 5,680,400 A   10/1997  York
6,052,385 A    4/2000  Kanerva
(Continued)

OTHER PUBLICATIONS

Ken Christense et al., IEEE 802.3az The Road to Energy Efficient Ethernet, IEEE Communications Magazine, Nov. 2010, 7 Pages.
(Continued)

*Primary Examiner* — Hirdepal Singh
(74) *Attorney, Agent, or Firm* — Lance Kreisman; Peninsula Patent Group

(57) ABSTRACT

Methods and apparatus for transmitting Ethernet data along an Ethernet link with a BASE-T transceiver are disclosed. One exemplary BASE-T Ethernet transceiver includes an Ethernet data framing module having an input interface to receive Ethernet block data bits at a first data rate. Logic associates the Ethernet block data bits with an auxiliary bit and a number of zero bits. An error encoder is coupled to the logic to encode all of the data bits, auxiliary bit and zero bits into an error encoded transport frame having plural error check bits. A symbol mapper receives the error encoded transport frame and transforms the error encoded transport frame into multiple symbols. A transmitter coupled to the symbol mapper transmits the multiple symbols over an Ethernet link at one of a selection of symbol rates. The data rate of data transmitted over the Ethernet link is based on the number of zero bits.

20 Claims, 18 Drawing Sheets

Related U.S. Application Data continuation-in-part of application No. 13/671,132, filed on Nov. 7, 2012, now Pat. No. 9,001,872.

(51) Int. Cl.
*H04L 12/825* (2013.01)
*H04L 12/931* (2013.01)
*G06F 11/10* (2006.01)
*H03M 13/11* (2006.01)

(52) U.S. Cl.
CPC .......... *H04L 1/0033* (2013.01); *H04L 1/0036* (2013.01); *H04L 1/0041* (2013.01); *H04L 1/0045* (2013.01); *H04L 1/0057* (2013.01); *H04L 47/25* (2013.01); *H04L 47/38* (2013.01); *H04L 49/351* (2013.01)

(58) Field of Classification Search
CPC ....... H04L 1/0036; H04L 47/25; H04L 47/38; H04L 49/351; H03M 13/1102; G06F 11/10
USPC .......................................... 375/219
See application file for complete search history.

(56) References Cited

U.S. PATENT DOCUMENTS

| | | | |
|---|---|---|---|
| 6,081,523 A | 6/2000 | Merchant et al. | |
| 6,111,890 A | 8/2000 | Rao | |
| 6,121,890 A | 8/2000 | Rao | |
| 6,195,360 B1 | 2/2001 | Raza et al. | |
| 7,027,407 B2 | 4/2006 | Diepstraten et al. | |
| 7,324,511 B2 | 1/2008 | Nishihara | |
| 7,525,992 B1 | 4/2009 | Shachal | |
| 7,567,620 B2 | 7/2009 | Rozental | |
| 7,593,431 B1 | 9/2009 | Lo et al. | |
| 7,693,240 B2 | 4/2010 | Mezer | |
| 7,720,075 B2 | 5/2010 | Costo | |
| 7,782,852 B2 | 8/2010 | Tellado et al. | |
| 8,112,646 B2 | 2/2012 | Tsai | |
| 8,201,005 B2 | 6/2012 | Wertheimer et al. | |
| 8,218,612 B2 | 7/2012 | Chien | |
| 8,243,752 B2 | 8/2012 | Barkan | |
| 8,276,013 B2 | 9/2012 | Diab et al. | |
| 8,320,411 B1 | 11/2012 | Sedarat et al. | |
| 8,644,341 B1* | 2/2014 | Petranovich | H04L 1/0041 370/473 |
| 8,938,035 B1* | 1/2015 | Dai | H04L 1/0054 375/341 |
| 9,106,364 B1* | 8/2015 | Singleton | H04K 1/00 |
| 9,143,142 B2 | 9/2015 | Meagher | |
| 2002/0006167 A1 | 1/2002 | McFarland | |
| 2002/0119783 A1 | 8/2002 | Bourlas et al. | |
| 2003/0016797 A1 | 1/2003 | Zakrzewski | |
| 2003/0040298 A1 | 2/2003 | Heatley | |
| 2004/0184810 A1 | 9/2004 | Spilman et al. | |
| 2005/0018784 A1 | 1/2005 | Kurobe | |
| 2005/0030808 A1 | 2/2005 | Brown et al. | |
| 2005/0055467 A1 | 3/2005 | Campana et al. | |
| 2005/0058152 A1 | 3/2005 | Oksanen et al. | |
| 2005/0105545 A1 | 5/2005 | Thousand et al. | |
| 2005/0152466 A1 | 7/2005 | Maltsev et al. | |
| 2005/0259685 A1 | 11/2005 | Chang et al. | |
| 2005/0286521 A1 | 12/2005 | Chiang | |
| 2006/0109784 A1 | 5/2006 | Weller et al. | |
| 2006/0153307 A1 | 7/2006 | Brown et al. | |
| 2006/0215561 A1 | 9/2006 | Wang et al. | |
| 2007/0081475 A1* | 4/2007 | Tellado | H04L 1/0003 370/255 |
| 2007/0192505 A1 | 8/2007 | Dalmia | |
| 2007/0248024 A1 | 10/2007 | Conway et al. | |
| 2008/0095188 A1 | 4/2008 | Remy | |
| 2008/0151792 A1 | 6/2008 | Taich | |
| 2008/0187028 A1 | 8/2008 | Lida | |
| 2008/0294919 A1 | 11/2008 | Lida et al. | |
| 2009/0080459 A1 | 3/2009 | Barkan | |
| 2009/0150745 A1 | 6/2009 | Langner et al. | |
| 2009/0282277 A1 | 11/2009 | Sedarat | |
| 2010/0075704 A1 | 3/2010 | McHenry et al. | |
| 2010/0115295 A1 | 5/2010 | Diab | |
| 2010/0188980 A1 | 7/2010 | Desai et al. | |
| 2010/0241923 A1 | 9/2010 | Wang et al. | |
| 2011/0249687 A1 | 10/2011 | Diab et al. | |
| 2012/0026922 A1 | 2/2012 | Diab | |
| 2012/0063295 A1 | 3/2012 | Bliss | |
| 2012/0106345 A1 | 5/2012 | Diab | |
| 2012/0170591 A1 | 7/2012 | Diab et al. | |
| 2012/0188894 A1 | 7/2012 | Huschke et al. | |
| 2013/0070823 A1* | 3/2013 | Malkin | H04L 25/03343 375/220 |
| 2014/0040704 A1 | 2/2014 | Wu et al. | |
| 2014/0050255 A1* | 2/2014 | Azizi | H04L 27/2666 375/219 |
| 2015/0030337 A1 | 1/2015 | Mateosky | |
| 2015/0067380 A1 | 3/2015 | Zhan et al. | |
| 2017/0207901 A1* | 7/2017 | Takatori | H04L 5/14 |

OTHER PUBLICATIONS

Hugh Barrass, EEE Exchange of Management Information, IEEE 802.3az EEE Task Force, Mar. 2009, Vancouver, British Columbia, 11 Pages.

Nariman Yousefi, Multi Rate PHY, IEEE Meeting Slides, Jul. 2003, 14 pages.

Zhang et al; IEEE Apr. 2010; pp. 843-855; "An Efficient 10GBASE-T Ethernet LDPC Decoder Design with Low Error Floors".

Mankar et al.; ACEEE, Proc of Intl. Conf. on Recent Trends in Information, Telecommunication and Computing, ITC; 5 pages; "Algorithms and Architectures for Reduced Complexity LDPC Decoding".

\* cited by examiner

PAM16 Symbol Stream

Bits grouping for LDPC frames

FIG. 6A
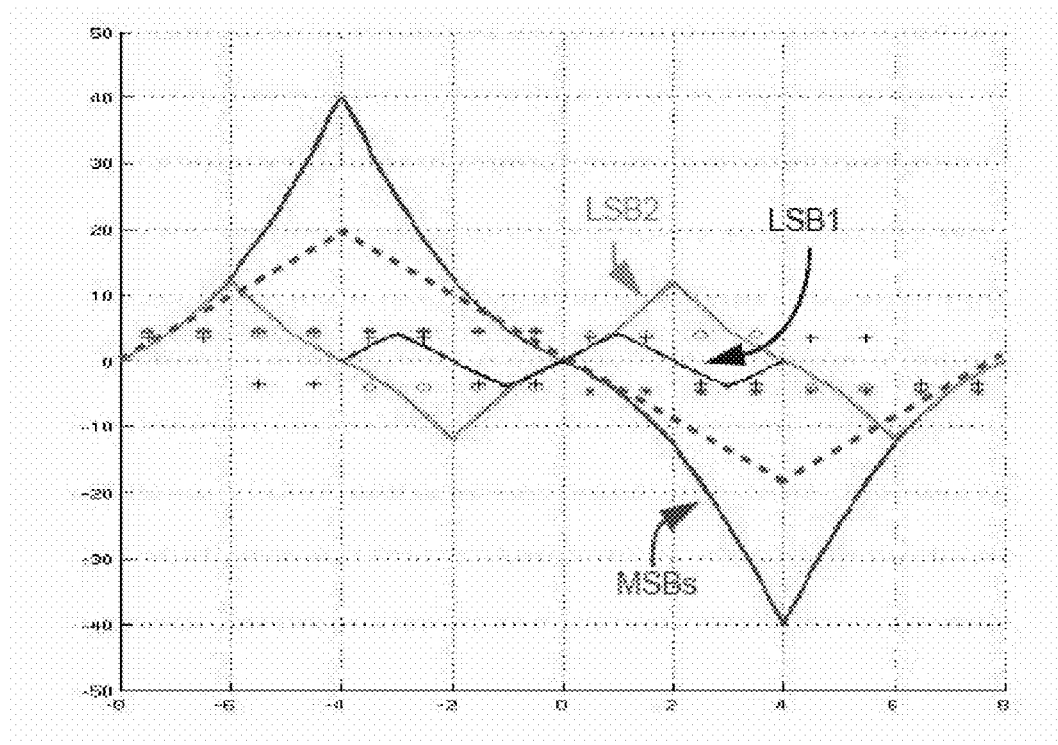
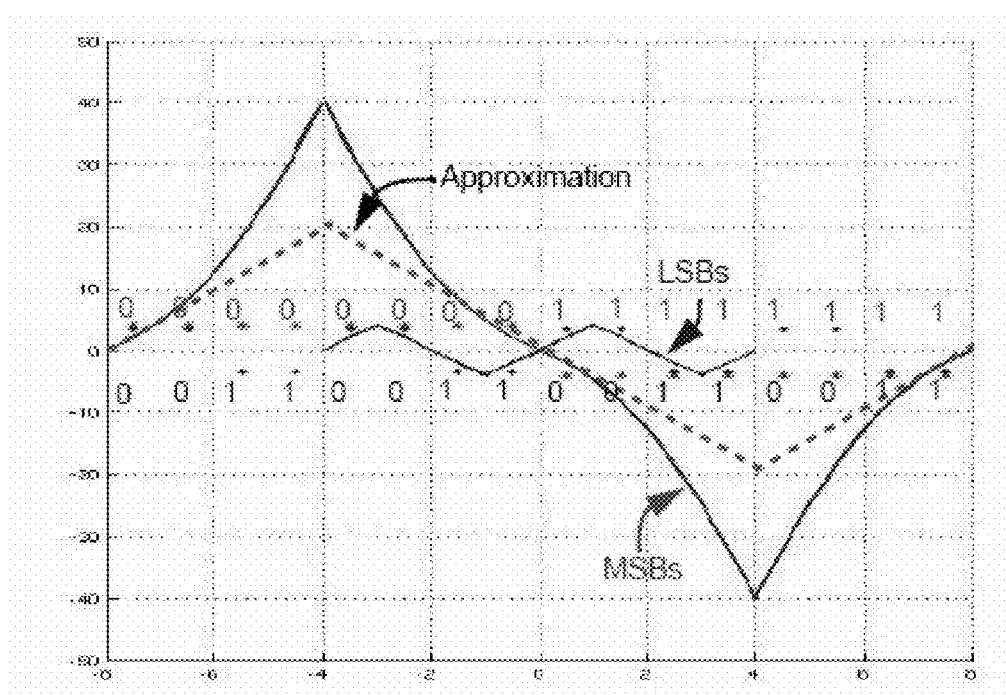
FIG. 6B

FIG. 17

| Bits $(b_0b_1b_2b_3)^1$ | Hex | Level |
|---|---|---|
| 0100 | 0x4 | +15 |
| 0101 | 0x5 | +13 |
| 0111 | 0x7 | +11 |
| 0110 | 0x6 | +9 |
| 0010 | 0x2 | +7 |
| 0011 | 0x3 | +5 |
| 0001 | 0x1 | +3 |
| 0000 | 0x0 | +1 |
| 1000 | 0x8 | -1 |
| 1001 | 0x9 | -3 |
| 1011 | 0xB | -5 |
| 1010 | 0xA | -7 |
| 1110 | 0xE | -9 |
| 1111 | 0xF | -11 |
| 1101 | 0xD | -13 |
| 1100 | 0xC | -15 |

FLEXIBLE DATA TRANSMISSION SCHEME ADAPTIVE TO COMMUNICATION CHANNEL QUALITY

CROSS-REFERENCE TO RELATED APPLICATIONS

This application is a Continuation of U.S. Ser. No. 14/504,318, filed Oct. 1, 2014, entitled A FLEXIBLE DATA TRANSMISSION SCHEME ADAPTIVE TO COMMUNICATION CHANNEL QUALITY, which is a Continuation-In-Part of U.S. Ser. No. 13/671,132, filed Nov. 7, 2012, entitled A FLEXIBLE DATA TRANSMISSION SCHEME ADAPTIVE TO COMMUNICATION CHANNEL QUALITY, all of which are expressly incorporated herein by reference.

TECHNICAL FIELD

The disclosure herein relates generally to electronic communications, and more particularly to coding and decoding data in electronic communications.

BACKGROUND

Transferring information between computers and other electronic devices can be implemented using any of a variety of different standards and technologies. Channel coding and error correction techniques can be used to reduce errors in received signals introduced from distortion and other disturbances. Such coding and error correction can be implemented using an encoder and a decoder at the ends of the transmission channel.

One increasingly popular communication standard is 10 Gigabit Ethernet, with a nominal data rate of 10 Gbit/s. 10GBASE-T is one such standard used to provide 10 gigabit per second connections over unshielded or shielded twisted pair cables. FIG. 1 illustrates a standard 10GBASE-T architecture, with respective first and second network devices 110a and 110b communicating via transceiver circuits 112a and 112b over a link 106. The wire-level modulation for 10GBASE-T is a Tomlinson-Harashima Precoded (THP) version of pulse-amplitude modulation with 16 discrete levels (PAM-16), encoded in a two-dimensional constellation pattern known as 128DSQ (Double Square QAM).

As shown in FIG. 2, the 10GBASE-T transport frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the low-density parity-check (LDPC) coder, and 1536 uncoded bits (3×512) that are not coded by the LDPC coder. The coded LDPC check bits (325 bits) are added to the end of the payload. The LDPC block size after coding is 2048 total bits (4×512). Together, the typical 10GBASE-T transport frame as shown in FIG. 2 contains 3584 bits, which includes the 3259-bit frame payload and the 325-bit LDPC check bits.

The resulting frame is modulated to 128DSQ symbols, and the resulting DSQ symbols are then precoded using THP. Each of these 512 128DSQ symbols are then transmitted as a pair of PAM-16 symbols (x-axis and y-axis), to create 1024 symbols (3584 bits, or 3.5 bits per symbol). The constellation for 128DSQ symbols is shown in FIG. 3, and consists of 8 cosets (regions), each coset containing 16 points. The coset label contains the 3 uncoded bits as shown in FIG. 3, and the points within the coset contain the 4 coded bits protected using the LDPC block code. The labeling of the points in the coset (the coset elements) conveying the 4 coded bits is also shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero). Using the 10GBASE-T transmission scheme, it is possible to have very low bit error rates that come very close to the Shannon limit of the communication channel.

While the transmission scheme described above works well for its intended applications, in some circumstances the link may be of a lower quality than anticipated, preventing the transceiver from communicating successfully at 10 Gb/s. The IEEE standard addresses the problem by requiring backwards compatibility to older Ethernet standards that communicate at rates of 1 Gb/s and/or 100 Mb/s. Thus, if the link is incapable of supporting 10 Gb/s, the transmission rate is scaled back to either 1 Gb/s or 100 Mb/s, or lower.

Scaling back the transmission rate in the conventional manner described above may unnecessarily limit the transmission rate far below what the link may be capable of supporting. For example, many industrial buildings and homes are wired with conventional CAT-5 cabling, which incorporates unshielded twisted-pair wires for older phone lines. CAT-5 cabling may in many cases support data rates between 2-7 Gb/s. Even if the cable is able to support 8 Gb/s, however, scaling back the data rate conventionally would dial down the transmission rate to 1 Gb/s, far below what could be supported.

Accordingly, what is needed is a system and method that provides more flexibility in scaling the data rates of 10GBASE-T Ethernet channels.

BRIEF DESCRIPTION OF THE DRAWINGS

In the features and advantages of the present invention are illustrated by way of example and are by no means intended to limit the scope of the present invention to the particular embodiments shown, and in which:

FIGS. 6A-6B respectively illustrate the LLR plots for the exemplary mappings illustrated in FIGS. 5A-5B;

FIG. 17 illustrates a grey-coding table for the symbol mapper of FIG. 14.

Like reference numerals refer to corresponding parts throughout the drawing figures.

DETAILED DESCRIPTION

Figure 1:
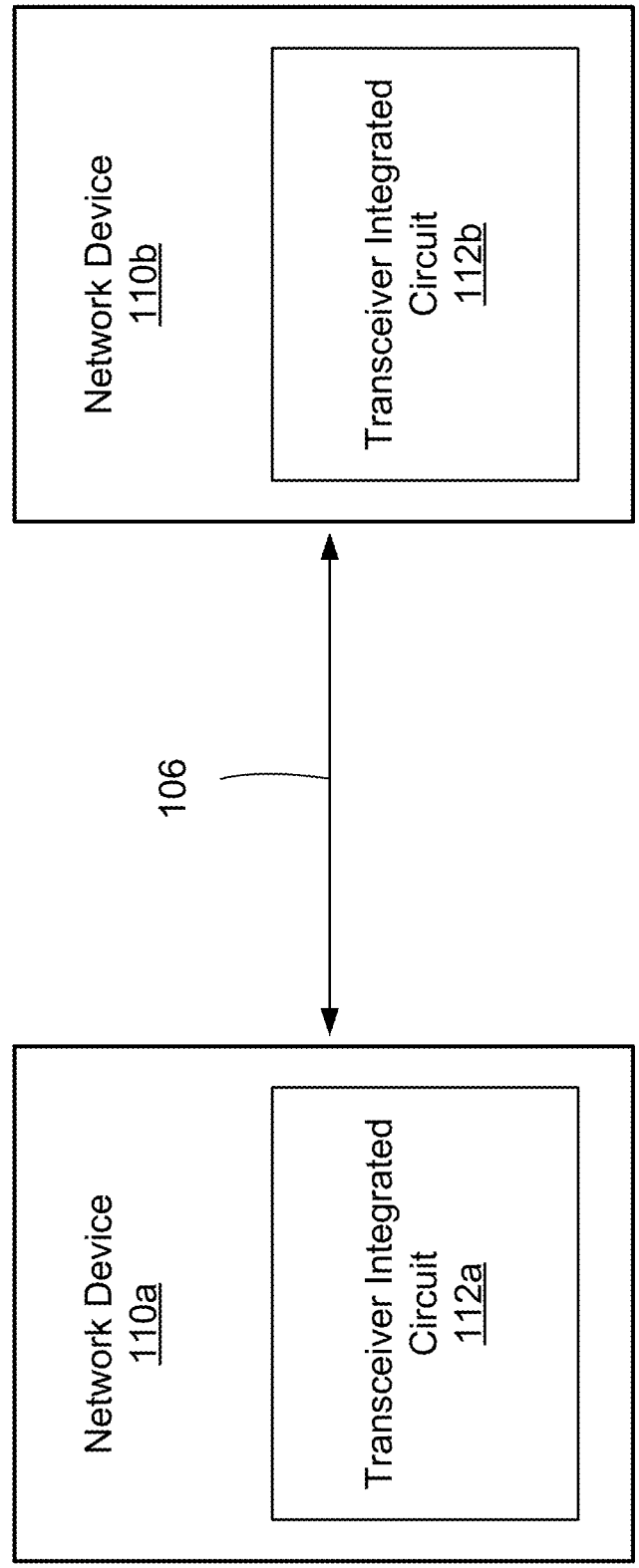
FIG. 1 illustrates a 10GBASE-T signaling link bounded by respective transceivers.
Figure 2:
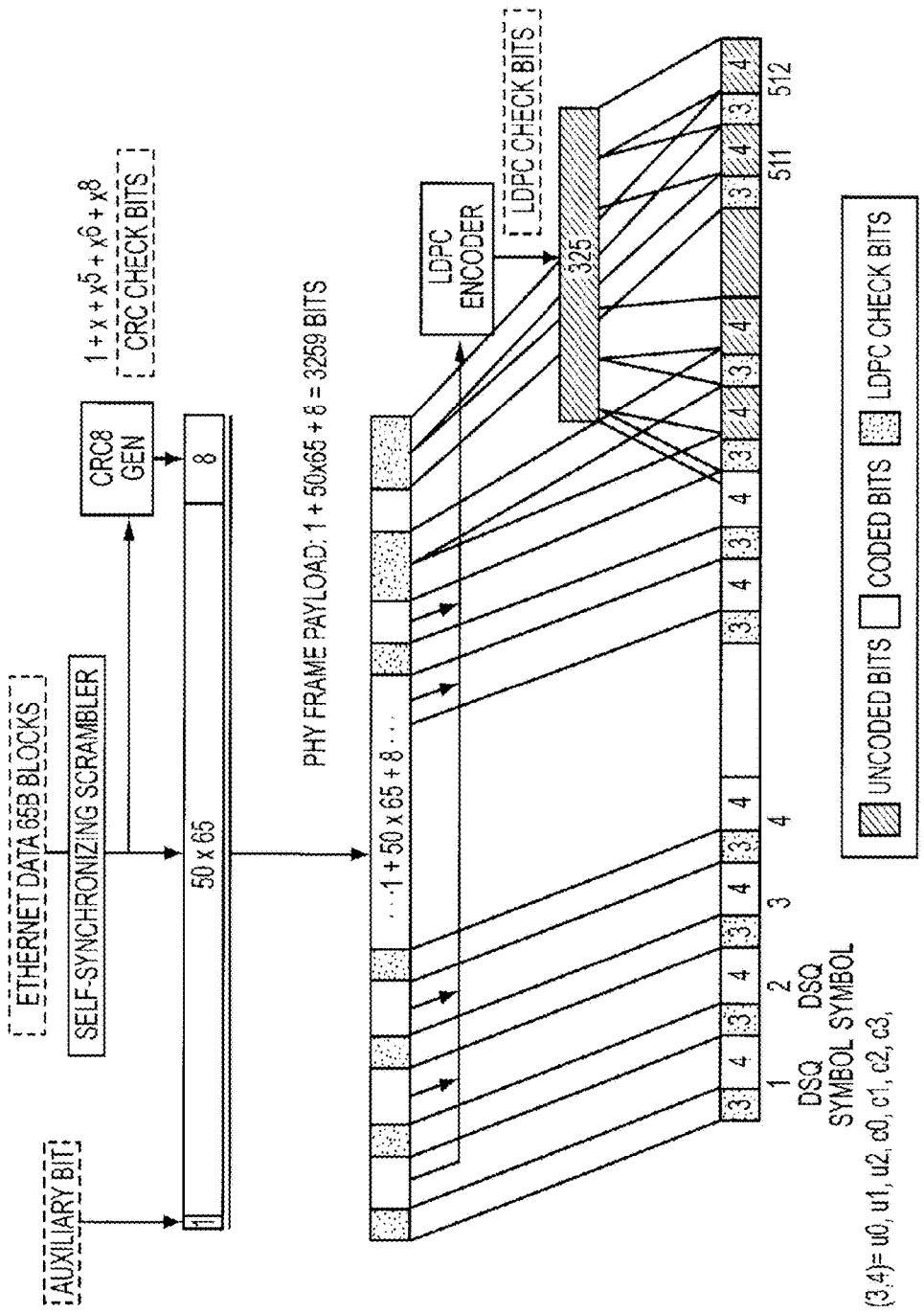
FIG. 2 illustrates a transmission frame for the 10GBASE-T communication standard.
Figure 3:
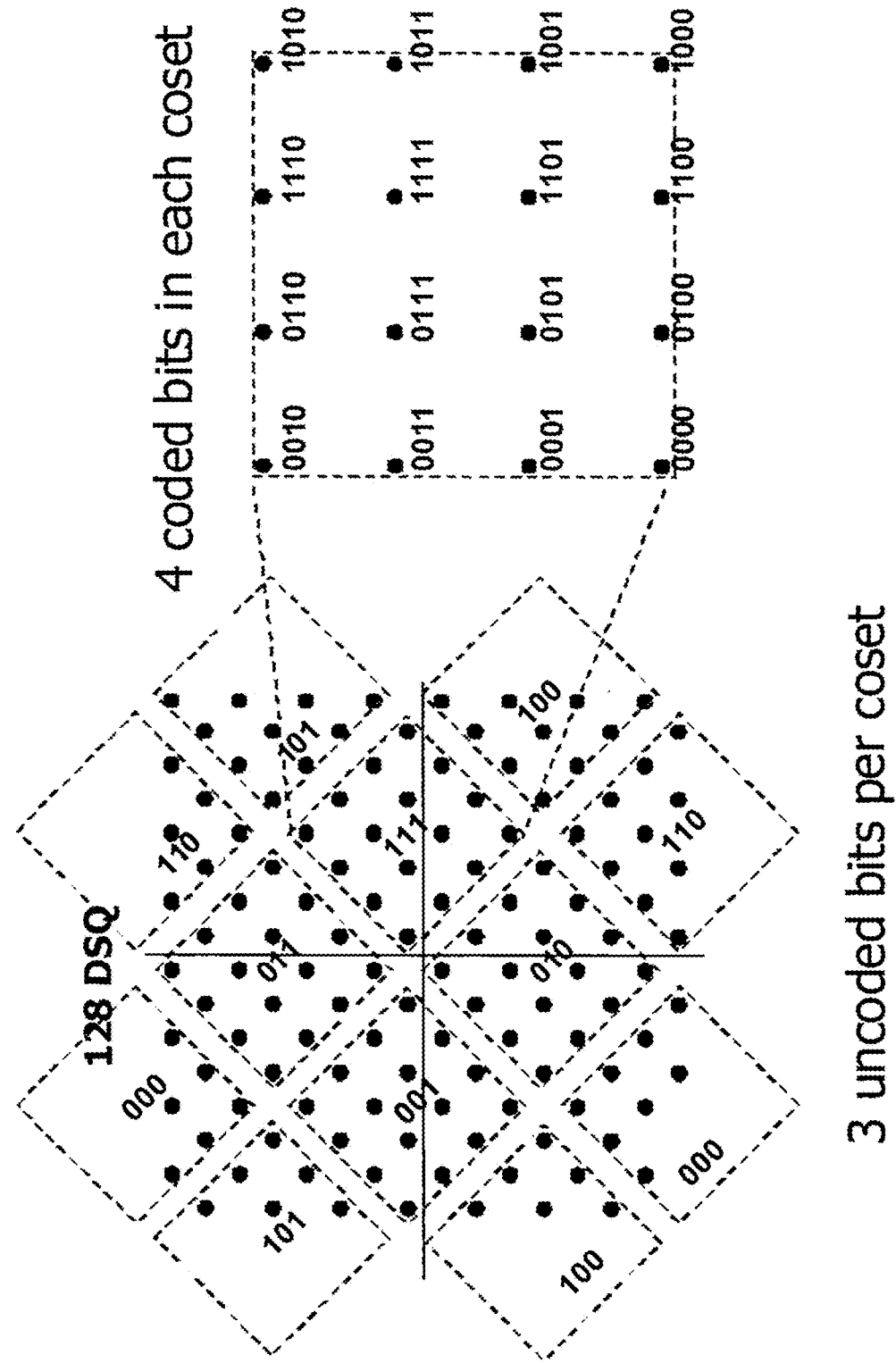
FIG. 3 illustrates a constellation for 128DSQ modulation used in the standard of FIG. 2 and the labeling of points in a Coset used with the constellation.

Methods and apparatus for transferring data along a link with a 10GBASE-T transceiver at a variable data rate are disclosed. One exemplary method includes detecting a link quality metric; and selecting a symbol transmission rate and a data modulation scheme based on the detected link quality metric. In some embodiments, the link quality metric can be detected by measuring a signal-to-noise ratio (SNR) from an existing transmission (e.g., from an existing transmission rate and data modulation). In other embodiments, the link quality metric can be detected by other suitable means including, for example, determining what type of transmission medium is used, or performing a training sequence. As provided in many embodiments, the detecting and the selecting are recursively performed when the detected link quality metric is less than a link quality threshold. For example, one or more embodiments can switch to a lower data modulation scheme and/or a lower symbol transmission rate if the link quality metric (e.g., from measuring SNR of the existing transmission) is below a certain predetermined link quality threshold. The link quality threshold (e.g., in forms of SNRs) in some embodiments may be chosen to meet or exceed a target bit error rate (BER). In many implementations, for a selected symbol transmission rate, if the detected link quality metric is less than a link quality threshold, then the selecting of the data modulation scheme is performed such that a data bit per symbol value represented by the selected data modulation scheme is decreased by at least ½ data bit per symbol. Many embodiments have exhibited that a ½ data bit per symbol reduction in the data modulation scheme may result in a 3 dB improvement in the signal SNR. Some embodiments further comprise choosing a modulation constellation mapping for LDPC framing based on the selected data modulation scheme. Additionally or alternatively, for the selected symbol transmission rate, if the detected link quality metric is less than the link quality threshold, and if the data bit per symbol value represented by the selected data modulation scheme is at a predetermined lowest possible value, then another symbol transmission rate which is slower than the selected symbol transmission rate is to be selected. At the new slower symbol transmission rate, the selection of the data modulation scheme may start from a predetermined highest possible value. The selected symbol transmission rate and the selected modulation together represent a selectable data rate from a selection of data rates.

As previously mentioned, scaling back the transmission rate in the conventional manner described above may unnecessarily limit the transmission rate far below what the link may be capable of supporting. Besides this wasted throughput, the aforementioned conventional 10GBASE-T transmission scheme leaves 3 of the 7 bits in each symbol essentially unprotected. The uncoded, unprotected bits, which typically do not cause problems if the transmission is performed via a higher quality physical channel such as a CAT6A cable and installations, may induce errors if the transmission is performed via a lower quality physical channel such as a CAT5e cables and installations that are certified up to only 100 MHz. Note that the standard 10GBASE-T signaling is operated at a symbol transmission rate of 800 MBaud, which puts the Nyquist bandwidth for baseband signaling at 400 MHz. Furthermore, even equipped with physical channels such as CAT6As, sometimes the channel can experience a larger than expected noise that can corrupt the uncoded bits. Therefore, in order to run in a sub-optimal noise environment while still utilizing the 10GBASE-T frame structure and LDPC machinery, various embodiments disclosed herein mitigate these adverse factors by one or more ways discussed below.

As mentioned above, a link quality metric can be determined in a variety of ways including, for example, measuring SNRs from existing transmissions, determining what type of medium is used, or performing training sequences. For simplicity, hereinafter the terms "link SNR", "link quality," "channel quality," or "link quality metric" may be used interchangeably. Also, hereinafter a "link quality threshold" may be directly referred to as a threshold value in units that the associated link quality metric uses. In some examples, the term "link quality metric" may be measured in "MHz" as it may refer to the Nyquist bandwidth of the symbol transmission rate which the link can support. In other examples, the term "link quality metric" may be measured in "dB" as it may refer to the signal SNR of the link. However, this practice should not be construed as limiting the meaning of the term "link quality metric" to any one of the many ways discussed herein.

In some embodiments, the uncoded bits are eliminated and LDPC coding is performed on all transmitted bits so as to provide a full coverage for the transmitted bits. Notably, this technique leads to almost doubling the operation of LDPC per cycle. However, typical LDPC architecture can process two frames simultaneously with only one iteration latency difference, so the latency of processing two frames in the LDPC decoder is minimal and is approximately one iteration delay.

Further, in many embodiments, the transmission symbol rate is reduced depending on the detected channel quality metric to maintain an acceptable quality. For example, considering that CAT5e cables are certified to support at least a link quality metric of 100 MHz, one embodiment is capable of operating at 200MBaud (or 200M symbols per second) with a Nyquist frequency of 100 MHz, so as to ensure satisfactory transmission operations across all existing CAT5e installations. Other additional or alternative implementations may also support higher intermediate speeds, such as 400MBaud for those CAT5e installations with better channel quality. Notably, given the fact that typical CAT5e cables have similar insertion loss (IL) as compared to CAT6/6A cable, reduced symbol transmission rates (e.g., 400MBaud or 200MBaud) can lead to significant improvement in IL at lower frequencies. Therefore, when operating at a lower than standard symbol transmission rate, denser constellations (or modulations) such as 256SQ (which is 4 data bit per symbol versus 3.5 data bit per symbol in 128DSQ of standard 10GBASE-T) can be utilized. Also, another major advantage of the reduced symbol transmission rates is the reduction of radiated emission over inferior CAT5e installations where cables are not well balanced differentially at higher frequencies, leading to higher differential to common-mode conversion and thus higher RF radiated emission.

Figure 4:
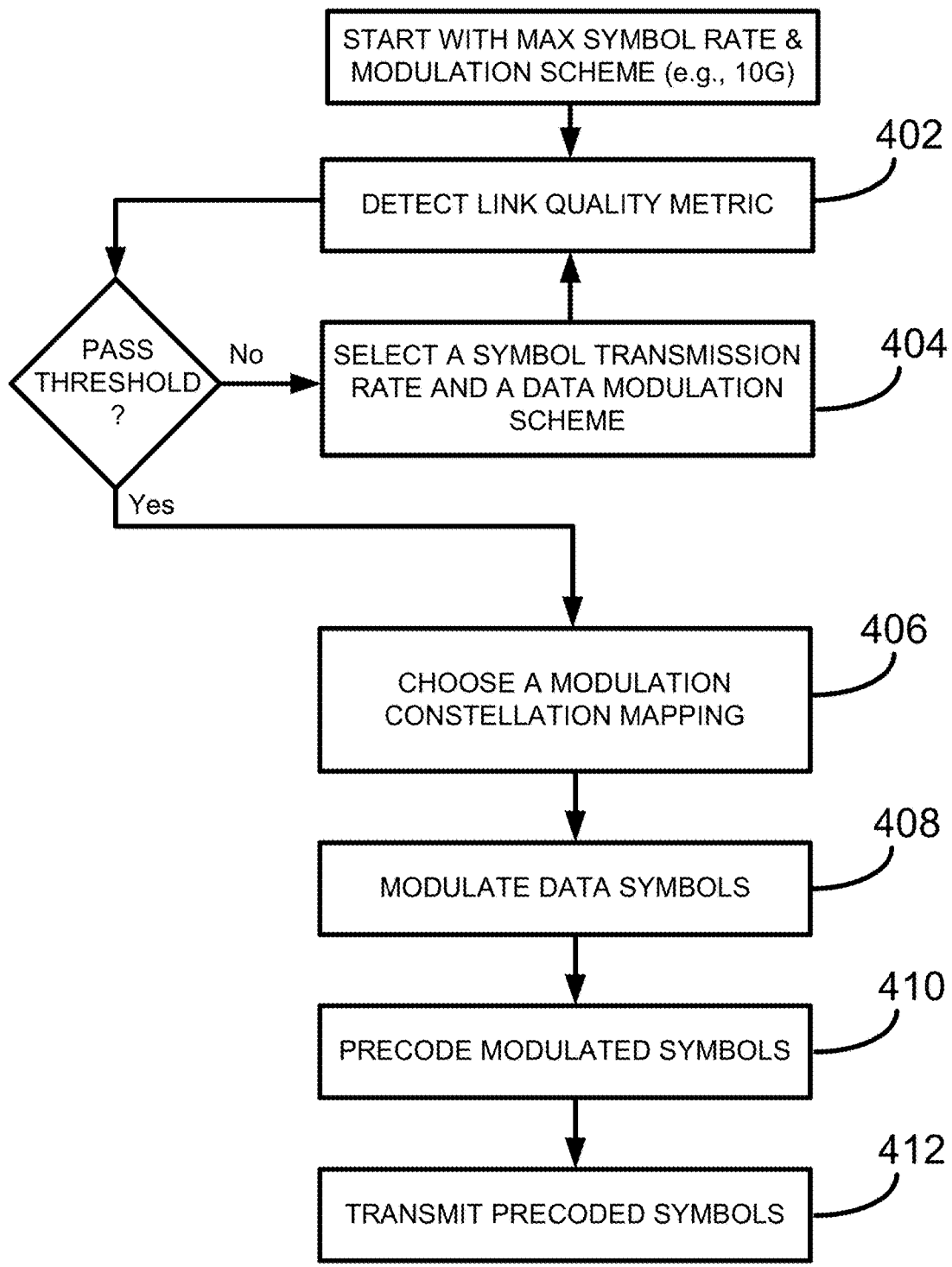
FIG. 4 illustrates a flowchart for a method of transmitting 10GBASE-T symbols.

FIG. 4 illustrates a generalized method of BASE-T symbol transmission that provides flexibility in reducing transmission data rates and/or reduced data modulation to account for inferior channels and/or reduced-power modes of operation. For purposes of discussion herein, all transmissions are assumed to be based on 10GBASE-T. The method begins by detecting a link quality metric (e.g., from one or more channel characteristics) for the 10GBASE-T lanes, at step 402, in order to detect what effective data rate can be supported. This may involve detecting signal SNR from existing transmissions, carrying out a training sequence and determining the highest effective data rate of the link at an acceptable bit-error-rate, or identifying the transmission medium, such as the cable type, and predicting the noise based on typical cable characteristics. A symbol transmission rate and a data modulation scheme are then selected based on the detected link quality. In many embodiments, a symbol transmission rate and a data modulation scheme that correspond to the maximum data rate are initially selected. The detecting of link quality metric and the selecting of symbol transmission rate and data modulation scheme may be recursively performed when the detected link quality metric is less than a link quality threshold. Possible symbol transmission rate includes a default 10GBASE-T symbol transmission rate of 800MBaud and other sub-rates that are less than 800MBaud, for example, 500MBaud, 400MBaud or 200MBaud, but not necessarily symbol transmission rates set at legacy Ethernet symbol rates, at step 404.

A suitable data modulation scheme is also selected for the system, at step 404. The selected data modulation scheme may be one from a group that includes symbol types based on the number of data bits provided in each symbol, more fully described below. The symbol types may correspond to a default mode corresponding to the conventional 10GBASE-T 128DSQ symbol, and other modes corresponding to a pure version of PAM-16 symbol (hereinafter "one-dimension PAM-16," or "1D PAM-16"), a 256SQ symbol, a modified version of 128DSQ symbol (hereinafter referred to as "Neo-128DSQ"), a 1D PAM-8 symbol, a 64SQ symbol, or a Neo-32DSQ symbol. The modulation constellation mapping may include Gray-Coding, Coset-Partitioning, or other suitable types of mapping for LDPC framing. Examples of modulations representing different data bit per symbol values and examples of different constellation mappings are discussed in fuller details below.

The selection of data modulation schemes generally corresponds to adjustments in the number of effective data bits per symbol. As aforementioned, in a typical 10GBASE-T operation, CAT6A cables are certified up to 400 MHz so that they can support transmissions at a symbol rate of 800MBaud with 128DSQ constellation modulation, each symbol of which represents 3.5 data bits (7 data bits per pair of symbols). According to many embodiments, for a selected symbol transmission rate, if the detected link quality metric is less than a link quality threshold, the selecting of the data modulation scheme is performed such that the data bit per symbol value represented by the selected data modulation scheme is adjusted down by at least ½ data bit per symbol. This may be done in conjunction with the symbol transmission rate adjustment/reduction. For example, if the supported link quality metric detected is less than 400 MHz at step 402 so that the symbol transmission rate is selected as 400MBaud, data modulation schemes representing 4 data bits per symbol such as 1D PAM-16 or 256SQ may also be selected depending on the quality of the channels. In other examples, data modulation schemes representing 3.5 data bits per symbol such as Neo-128DSQ may be employed with the 400MBaud symbol transmission rate to reach a desirable link quality. Together, the symbol transmission rate and the selected modulation scheme represent a selectable data rate from a selection of data rates. More specifically, a data rate represented by the symbol transmission rate and the selected modulation scheme can include a default 10GBASE-T data rate of 10 Gb/s as well as other data rates. For example, a selection of data rates can be selected that are less than 10 Gb/s but not necessarily set at legacy Ethernet data rates (e.g., 1 Gb/s). Table 1 is an exemplary list of the selection of data rates that may be achieved by the techniques discussed above. Note that the "net data rate" shown in Table 1 includes rate reduction from modulation and other overheads such as LDPC correction bits overhead, Ethernet 64b/65b overhead, etc.

TABLE 1

| Modulation | Symbol Rate (Mbaud) | Theoretical Data Bit/ Symbol | SNR vs 128DSQ (dB) | Net Data Rate (Gbps) |
| --- | --- | --- | --- | --- |
| 1D PAM-16 | 500 | 4 | −3 | 6.62 |
| 1D PAM-16 | 400 | 4 | −3 | 5.29 |
| 256SQ | 400 | 4 | −3 | 5.29 |
| Neo-128DSQ | 400 | 3.5 | 0 | 4.51 |
| 1D PAM-8 | 400 | 3 | 3 | 3.92 |
| 64SQ | 400 | 3 | 3 | 3.92 |
| Neo-32DSQ | 400 | 2.5 | 6 | 3.23 |
| 1D PAM-16 | 200 | 4 | −3 | 2.65 |
| 256SQ | 200 | 4 | −3 | 2.65 |
| Neo-128DSQ | 200 | 3.5 | 0 | 2.25 |
| 1D PAM-8 | 200 | 3 | 3 | 1.96 |

Although not illustrated in FIG. 4 for simplicity, one or more typical steps associated with 10GBASE-T Ethernet data transmission may also be performed at step 406. For example, LDPC encoding may be performed on the data payload, LDPC parity bits may be generated, and an LDPC block (which includes the data payload and the LDPC parity bits) may be assembled after the data modulation scheme is selected.

Additionally, a corresponding modulation constellation mapping for LDPC framing can be chosen based on the selected data modulation scheme. According to some embodiments, the corresponding mapping may be Coset-partitioning or Gray-Coding, depending on the application. Generally speaking, Gray-Coding may provide better noise margin on particular bits, while Coset-partitioning may provide the flexibility of whether or not to code all the data bits. More details on the mapping options are discussed below.

Following the modulation scheme selection at step 406, the data bits in the LDPC block are then modulated according to the selected data modulation scheme and the mapping to become data symbols, at step 408, and precoded by a THP precoder, at step 410. The precoded symbols may then be transmitted by the 10GBASE-T transceiver, at step 412. One specific example of a 10GBASE-T transceiver architecture capable of carrying out the coding and decoding functionality described herein is disclosed in U.S. patent application Ser. No. 12/563,938, titled "Cancellation of Alien Interference in Communication Systems", assigned to the Assignee of the present disclosure, and expressly incorporated by reference herein in its entirety.

With the exemplary method illustrated in FIG. 4, the wasted throughput associated with unnecessarily limiting the transmission rate far below what the link may be capable of supporting (e.g., dialing down from 10 Gb/s to 1 Gb/s while the link may support 5 Gb/s) is reduced as well as unwanted radiated emissions when performing Ethernet transmission over impaired or inferior physical channels. Also, many of the disclosed embodiments enjoy the benefit of higher SNR margin as compared to the standard 10GBASE-T system.

The following describes various examples of different modulation schemes that respectively represent different data bit per symbol values. The disclosed examples have been presented for the purposes of illustration and description. It is not intended to be exhaustive or to limit the invention to the precise forms disclosed. A person having ordinary skill in the art would appreciate that the techniques for implementing one modulation scheme representing one data bit per symbol value can be modified to implement another modulation scheme representing another data bit per symbol value without exceeding the scope of the current disclosure. For example, techniques for implementing an 1D PAM-16 modulation scheme can be modified to implement an 1D PAM-8 modulation scheme, and vice versa. Similarly, techniques implementing a 256SQ scheme can be modified to deploy a 64SQ scheme, and techniques implementing a Neo-128DSQ scheme can be modified to deploy a Neo-32DSQ scheme.

One-Dimension PAM-16 Modulation

Experimental data have shown that the SNR margin as well as other performance indicators (e.g., radiated emission) of transmitting signals at 400MBaud on a CAT5e cable is better or at least comparable to transmitting signals at 800MBaud on a standard CAT6A cable. For example, while the differential to common-mode conversion (or radiated emission) of the CAT5e cable shows to be around 6 dB worse than CAT6A when transmitting at 800MBaud, the CAT5e cable demonstrates an improvement around 10 dB when transmitting at 400MBaud. Therefore, as mentioned above, when symbol transmission rate is selected to be low enough compared to the default standard rate, denser modulations such as 1D PAM-16 or 256SQ may be utilized. Compared to the standard 128-DSQ, in 1D PAM-16 modulation, every 16-level symbol represents 4 data bits by the symbol itself independent of other symbol(s), as opposed to square constellations (SQ) requiring a pair of symbols to together represent X number of data bits.

Figure 5A:
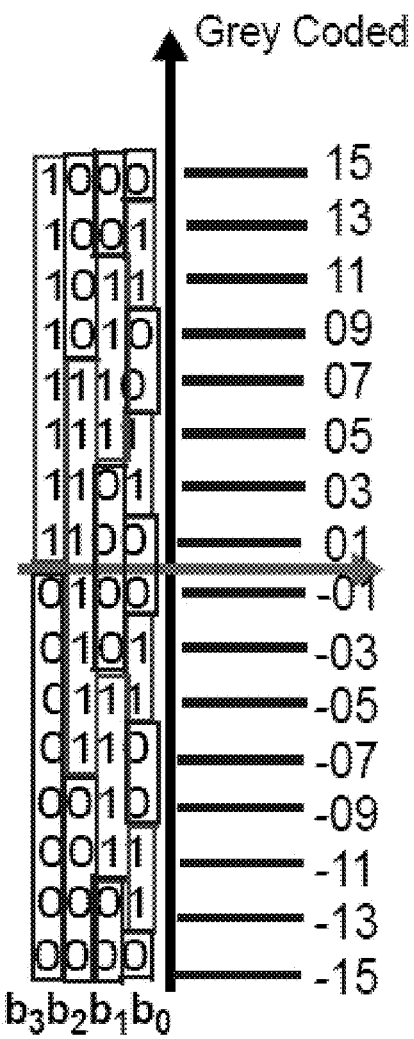
FIG. 5A illustrates one embodiment of the 1D PAM-16 modulation that utilizes Gray-Coding to map the data bits.
Figure 5A:
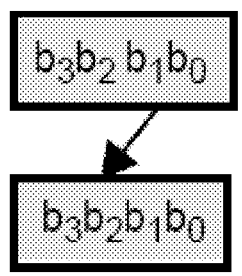

FIG. 5A shows one embodiment of the 1D PAM-16 modulation that utilizes Gray-Coding to map the data bits. As shown in FIG. 5A, all four bits are mapped using Gray-Coding to the 16 levels so that the LDPC may encode/decode all four bits of a symbol together in one LDPC frame. As such, 1D PAM-16 is a modulation scheme that represents a data bit per symbol value of 4. The hamming distance between points in this modulation with 16 levels is around 24 dB less than a simple PAM-2 modulation, and therefore it is desirable to perform forward error correction (FEC) coding on the data bits. One of the many advantages of the approach illustrated in FIG. 5A is that the combining of the high SNR most significant bits (MSBs) with least significant bits (LSBs) for coding increases the coding gain. Another advantage is that the Gray-Coding leads to fewer transitions between 1s and 0s in the mapping of second LSB, thereby further reducing the chances of having errors.

For purposes of discussion herein, MSBs are the bit positions having the greatest values in a binary number, and the LSBs are the remaining bit positions that are not MSBs. In one typical example, for a binary number that has an even number of bits, the number of MSBs is ½ of the total number of bits. For a binary number that has an odd number of bits, depending on embodiments, the number of MSBs may be either the closest integer rounded up from ½ of the total number of bits or the closest integer rounded down from ½ of the total number of bits. However, a person having ordinary skill in the art will know that the number of MSB bits and LSB bits may be arbitrarily selected in order to suit a particular application, and that it is not necessary for the number of MSBs to be roughly equal to the number of LSBs. For example, in certain embodiments, a 5-bit binary number may have a 1-bit MSB and the rest 4 bits are LSBs.

Figure 5B:
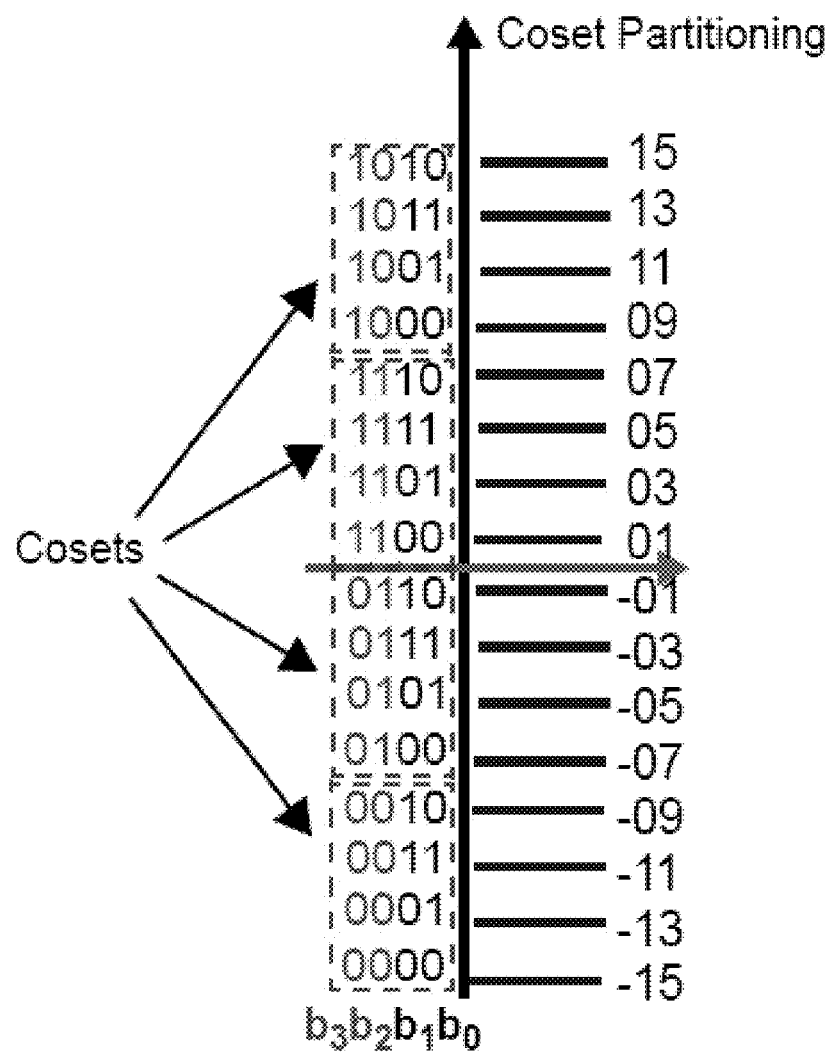
FIG. 5B illustrates one embodiment of the 1D PAM-16 modulation that utilizes Coset-Partitioning to map the data bits.
Figure 5B:
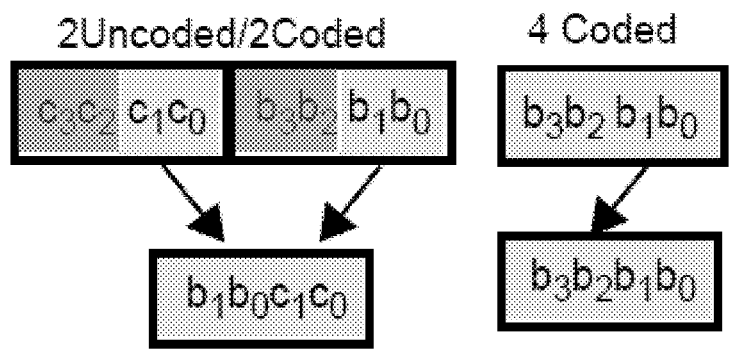

FIG. 5B shows one embodiment of the 1D PAM-16 modulation that utilizes Coset-Partitioning to map the data bits. As shown in FIG. 5B, there are 2 LSB bits within each Coset, and therefore four 2-bit Cosets can be identified by 2 MSB bits. Similar to the 1D PAM-16 with Gray-Coding in FIG. 5A, the hamming distance between points in this constellation is around 24 dB less than a simple PAM-2 modulation, and therefore it is desirable to perform forward error correction (FEC) coding on at least some if not all of the 4 bits in the symbol to increase the system's SNR margin. The Coset-Partitioning mapping provides the flexibility to have the LSB bits coded for FEC, while leaving the MSB bits uncoded. The FEC may be Low Density Parity Check (LDPC), which is typical for the standard 10GBASE-T, or other suitable FEC algorithms.

The framing of bits for coding may be done in several ways. In one example, all the LSB bits are grouped together and all the MSB bits are grouped together to form separate LDPC frames for LSBs and MSBs. In another example, the LSB and MSB bits are combined within a symbol to form a frame and are encoded/decoded together. The latter example may have a coding advantage because it combines the higher SNR bits of MSB with the LSB bits, thereby resulting in a better final coding gain. As an additional benefit, the latter example also enjoys less framing latency on the receiving side than the former example in building a complete frame because all the data bits from a 1D PAM-16 symbol are used to form the frame, not just LSBs or MSBs.

For decoding (e.g., on a receiving link partner), in the Coset-Partitioned PAM16 where LSBs and MSBs are grouped and framed separately, the LSBs frame may be decoded first, and then the decoded LSB bits information may be used to slice the MSB bits so that SNR margin would be become 12 dB higher. This may be achieved because the fact that once the 2-bit LSB values within the Coset is known, the other 3 combinations can be removed, thereby increasing the minimum hamming distance for the remaining undecoded points by 4 times for Coset slicing. Consequently, the encoding/decoding of the MSB bits may be skipped due to this 12 dB SNR gain.

In some embodiments, the MSB bits can also be coded for further SNR gain in systems where very large but localized disturbances are present. One example of such disturbances is caused by constructive superposition of non-linear signal reflections that can lead to a large disturbance for a limited time window.

FIGS. 6A-6B show the LLR plots for the exemplary mappings illustrated in FIGS. 5A-5B, respectively. The log-likelihood function used for plotting all points can be represented as:

$$LLR_{b_i}(x) = \ln\left(\frac{p_{b_i=0} \mid x}{p_{b_i=1} \mid x}\right)$$

For simplicity, the following discussion focuses on the example illustrated in FIG. 6A. For LSB1 where its value changes every two bits, the corresponding LLR can be represented as:

$$LLR_b(x) = \ln\left(\frac{\frac{1}{\sigma\sqrt{2\pi}}\left(e^{-\left(\frac{x-\frac{\mu}{2}}{\sigma\sqrt{2}}\right)^2} + e^{-\left(\frac{x-\frac{3\mu}{2}}{\sigma\sqrt{2}}\right)^2} + e^{-\left(\frac{x+\frac{5\mu}{2}}{\sigma\sqrt{2}}\right)^2} + e^{-\left(\frac{x+\frac{7\mu}{2}}{\sigma\sqrt{2}}\right)^2} + \ldots\right)}{\frac{1}{\sigma\sqrt{2\pi}}\left(e^{-\left(\frac{x+\frac{\mu}{2}}{\sigma\sqrt{2}}\right)^2} + e^{-\left(\frac{x+\frac{3\mu}{2}}{\sigma\sqrt{2}}\right)^2} + e^{-\left(\frac{x-\frac{5\mu}{2}}{\sigma\sqrt{2}}\right)^2} + e^{-\left(\frac{x-\frac{7\mu}{2}}{\sigma\sqrt{2}}\right)^2} + \ldots\right)}\right)$$

Where μ is the hamming distance between points in the constellation and σ is the sigma of noise for each point. As can be seen from FIG. 6A, the LLR function for the LSB1 ($b_0$) is a sawtooth function, which is similar to the existing 10GBASE-T 128DSQ (after the constellation rotation), except that the hamming distance between each point is 3 dB less. Thus, the LLR for the LSB1 bit can be approximated by:

$$LLR_{b0}(x) = \frac{\mu^2}{2\sigma^2}\begin{cases} x & 0 \le x < 1 \\ 2-x & 1 \le x < 3 \\ x-4 & 3 \le x < 4 \end{cases}$$

Where the sigma is the original sigma defined for the rotated 128DSQ constellation in the existing LDPC design for standard 10GBASE-T.

For LSB2 ($b_1$) where the bit changes for every 4 consecutive points, the corresponding LLR may be represented as follows:

$$LLR_B(x) = \ln\left(\frac{\frac{1}{\sigma\sqrt{2\pi}}\left(e^{-\left(\frac{x+\frac{\mu}{2}}{\sigma\sqrt{2}}\right)^2} + e^{-\left(\frac{x+\frac{3\mu}{2}}{\sigma\sqrt{2}}\right)^2} + e^{-\left(\frac{x-\frac{5\mu}{2}}{\sigma\sqrt{2}}\right)^2} + e^{-\left(\frac{x-\frac{7\mu}{2}}{\sigma\sqrt{2}}\right)^2} + e^{-\left(\frac{x+\frac{9\mu}{2}}{\sigma\sqrt{2}}\right)^2} + e^{-\left(\frac{x+\frac{11\mu}{2}}{\sigma\sqrt{2}}\right)^2} + e^{-\left(\frac{x-\frac{13\mu}{2}}{\sigma\sqrt{2}}\right)^2} + e^{-\left(\frac{x-\frac{15\mu}{2}}{\sigma\sqrt{2}}\right)^2} + \ldots\right)}{\frac{1}{\sigma\sqrt{2\pi}}\left(e^{-\left(\frac{x-\frac{\mu}{2}}{\sigma\sqrt{2}}\right)^2} + e^{-\left(\frac{x-\frac{3\mu}{2}}{\sigma\sqrt{2}}\right)^2} + e^{-\left(\frac{x+\frac{5\mu}{2}}{\sigma\sqrt{2}}\right)^2} + e^{-\left(\frac{x+\frac{7\mu}{2}}{\sigma\sqrt{2}}\right)^2} + e^{-\left(\frac{x-\frac{9\mu}{2}}{\sigma\sqrt{2}}\right)^2} + e^{-\left(\frac{x-\frac{11\mu}{2}}{\sigma\sqrt{2}}\right)^2} + e^{-\left(\frac{x+\frac{13\mu}{2}}{\sigma\sqrt{2}}\right)^2} + e^{-\left(\left(\frac{x+\frac{15\mu}{2}}{\sigma\sqrt{2}}\right)^2\right)} + \ldots\right)}\right)$$

The LLR function can still be approximated with straight lines. As such, we can effectively use a similar or the same LLR logic as for the LSB1 bit for the LSB2 bit. The following function represents the approximation:

$$LLR_{b1}(x) = \left(h \cdot \frac{\mu^2}{2\sigma^2}\right)\begin{cases} x & 0 \le x < 2 \\ 4-x & 2 \le x < 6 \\ x-8 & 6 \le x < 8 \end{cases}$$

As an alternative, the amplitude can be divided by a factor of 2 (e.g., by right shifting one bit) and the same LLR function as that of the LSB1's can be used (e.g., with a different scale conversion). Considering the divided-by-two change, the new LLR equation for the LSB2 bit can be represented as:

$$LLR_{b1}(x) = \left(h \cdot \frac{\mu^2}{2\sigma^2}\right)\begin{cases} x & 0 \le x < 1 \\ 2-x & 1 \le x < 3 \\ x-4 & 3 \le x < 4 \end{cases}$$

Note that the factor h is an adjustment factor that is adjustable in the LLR logic hardware in order to optimize for better transmission performance. In one embodiment, the value range of h is from 1~2.

For MSB bits ($b_3 b_2$) where the bit changes for every 8 consecutive points, the LLR function can be represented as follows:

$$LLR_B(x) = \ln\left(\frac{\frac{1}{\sigma\sqrt{2\pi}}\left(e^{-\left(\frac{x+\frac{\mu}{2}}{\sigma\sqrt{2}}\right)^2} + e^{-\left(\frac{x+\frac{3\mu}{2}}{\sigma\sqrt{2}}\right)^2} + e^{-\left(\frac{x+\frac{5\mu}{2}}{\sigma\sqrt{2}}\right)^2} + e^{-\left(\frac{x+\frac{7\mu}{2}}{\sigma\sqrt{2}}\right)^2} + e^{-\left(\frac{x-\frac{9\mu}{2}}{\sigma\sqrt{2}}\right)^2} + e^{-\left(\frac{x-\frac{11\mu}{2}}{\sigma\sqrt{2}}\right)^2} + e^{-\left(\frac{x-\frac{13\mu}{2}}{\sigma\sqrt{2}}\right)^2} + e^{-\left(\frac{x-\frac{15\mu}{2}}{\sigma\sqrt{2}}\right)^2} + \ldots\right)}{\frac{1}{\sigma\sqrt{2\pi}}\left(e^{-\left(\frac{x-\frac{\mu}{2}}{\sigma\sqrt{2}}\right)^2} + e^{-\left(\frac{x-\frac{3\mu}{2}}{\sigma\sqrt{2}}\right)^2} + e^{-\left(\frac{x-\frac{5\mu}{2}}{\sigma\sqrt{2}}\right)^2} + e^{-\left(\frac{x-\frac{7\mu}{2}}{\sigma\sqrt{2}}\right)^2} + e^{-\left(\frac{x-\frac{9\mu}{2}}{\sigma\sqrt{2}}\right)^2} + e^{-\left(\frac{x-\frac{11\mu}{2}}{\sigma\sqrt{2}}\right)^2} + e^{-\left(\frac{x-\frac{13\mu}{2}}{\sigma\sqrt{2}}\right)^2} + e^{-\left(\left(\frac{x-\frac{15\mu}{2}}{\sigma\sqrt{2}}\right)^2\right)} + \ldots\right)}\right)$$

While the curve for this LLR is not a simple sawtooth function like the LSBs' LLRs, approximation of the LLR function with straight lines can still be employed without losing much of the LDPC performance. Therefore, the same LLR logic as for LSB bits can be used for the MSB bits. The following function may be used to represent the approximation:

$$LLR_B(x) = \left(-k \cdot \frac{\mu^2}{2\sigma^2}\right) \begin{cases} x & 00 \leq x < 04 \\ 8-x & 04 \leq x < 12 \\ x-16 & 12 \leq x < 16 \end{cases}$$

Note that the factor k is an adjustment factor that is adjustable in the LLR logic hardware in order to optimize for better transmission performance. In one embodiment, the value range of k is from 1~2.

Again, as an alternative embodiment, the amplitudes may be divided by a factor of 4 (e.g., by right shifting 2 bits), and the same LLR function as that for the LSBs can be used. Considering the divided-by-four change, a new LLR function for the Superset bit can be represented as:

$$LLR_B(x) = \left(-k \cdot \frac{2\mu}{\sigma^2}\right) \begin{cases} x & 0 \leq x < 1 \\ 2-x & 1 \leq x < 3 \\ x-4 & 3 \leq x < 4 \end{cases}$$

Because there are 2 MSB bits and therefore 2 LLRs, the LLR functions for each of the 2 bits can be obtained by applying offsets to the LLR variables. One example of input variable conversions is:

$$x_0 = \frac{(x+1.5)}{1} \bmod 4$$

$$x_1 = \frac{(x+2.5)}{2} \bmod 4$$

$$x_2 = \frac{(x+4.5)}{4} \bmod 4$$

$$x_3 = \frac{(x+0.5)}{4} \bmod 4$$

Where $x_i$ is the new variable in the corresponding LLR equation for $b_i$.

Figure 7:
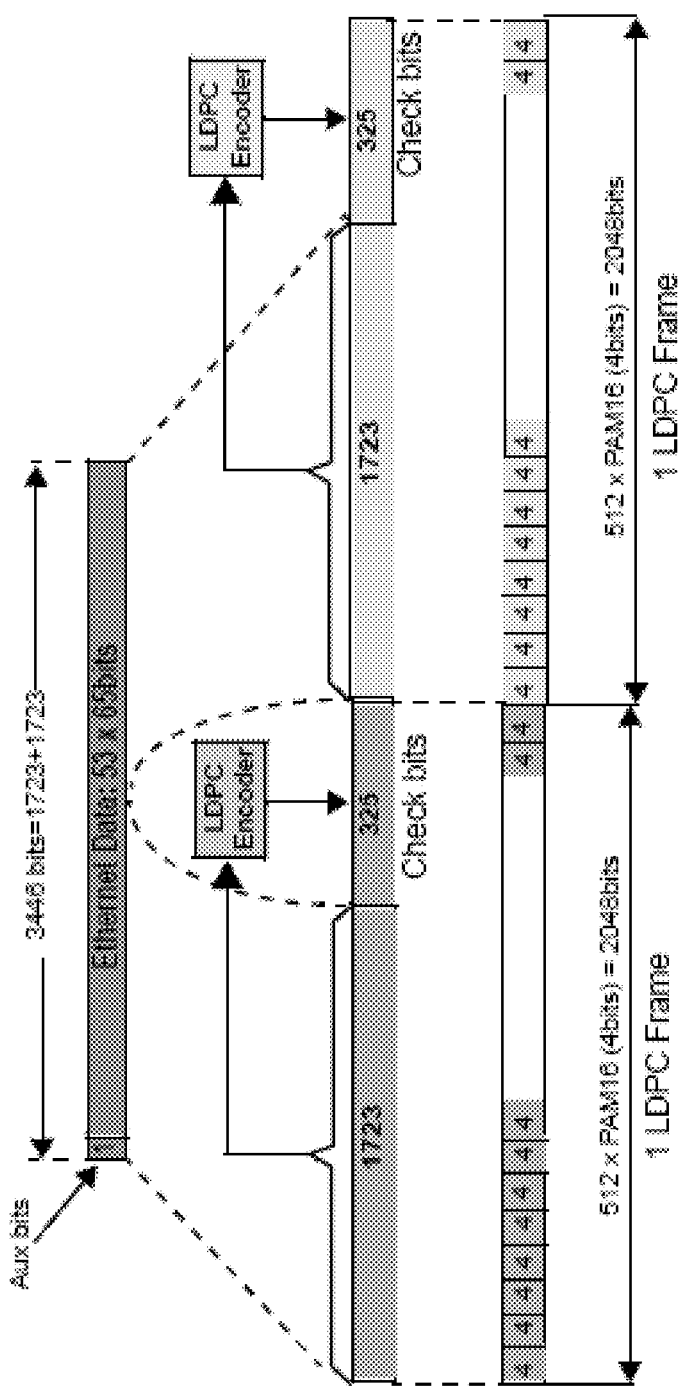
FIG. 7 illustrates an exemplary grouping of 53×65-bit Ethernet data and the associated LDPC parity bits into two sets of 512 1D PAM-16 symbols.

FIG. 7 shows an exemplary grouping of 53×65-bit Ethernet data and the associated LDPC parity bits into two sets of 512 1D PAM-16 symbols, where each symbol includes 4 bits. One of the many advantages the 1D PAM-16 constellation illustrated in FIG. 5A provides as compared to the standard 10GBASE-T 128DSQ constellation is that all bits in each 512 symbol carry the coded bits for a single LDPC frame. As such, the latency to buffer and to form the 2048-bit LDPC frame reduces significantly.

256SQ Modulation

Figure 8:
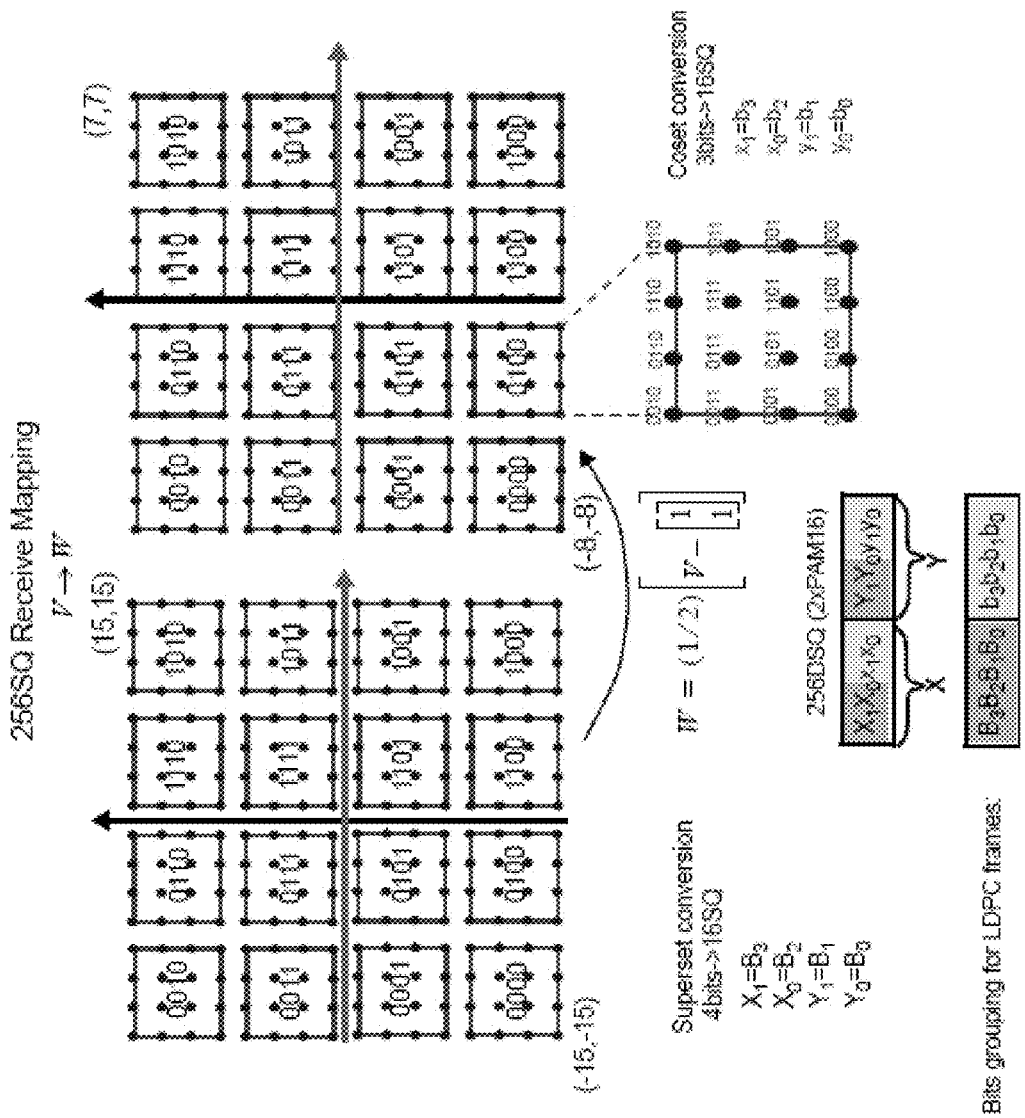
FIG. 8 illustrates an exemplary 256SQ constellation and its LDPC encode/decode grouping.

FIG. 8 illustrates an embodiment of a 256SQ constellation and its LDPC encode/decode grouping. The 256SQ constellation is another example of a modulation scheme that represents a data bit per symbol value of 4. Unlike the above mentioned 1D PAM-16, each symbol in the 256SQ modulation scheme carries 8 bits of data and is represented by a pair of 16-level symbols. Therefore, a 256SQ constellation includes 16 subsets of 16SQ points (or 16 Cosets), and one set of 16Q subsets (or Superset) as shown. The hamming distance between each 16SQ subset point (illustrated in FIG. 8 as the points inside the squares) is the same as the 1D PAM-16 discussed above. Each node of the 16 nodes in the 16SQ Superset is one of the 16 Cosets, and therefore, if the slicing uses the Coset decoded bits to identify the correct location within the Coset, the hamming distance between each Superset point may be 12 dB better than that of the Coset points. Without information from coded bits, the hamming distance for the Superset points is the same as the Coset points.

In many embodiments of the 256SQ scheme, considering the possible high return loss (RL) in inferior installations (e.g., CAT5e cables) at above 100 MHz and high sensitivity of uncoded bits due to bad channel RL, the 16SQ Superset bits are also coded and protected by LDPC. Optionally, decoded Coset bit information can still be used in calculating Log Likelihood Ratios (LLRs) for the Superset bits before LDPC decoder, which may provide around 12 dB of additional SNR margin. Nonetheless, while causing more latency to the transmission data path, experimental data have shown that the additional SNR gain may not be as beneficial as expected because the limitation on the Coset bits' SNR margin. Therefore, in one embodiment, the LLRs for Coset bits and Superset bits are calculated separately. One of the many advantages of the 256SQ constellation is that the LLR values for each Coset bit or Superset bit is only dependent on one axis (e.g., the x-axis or the y-axis), thereby simplifying the LLR calculations.

Figure 9:
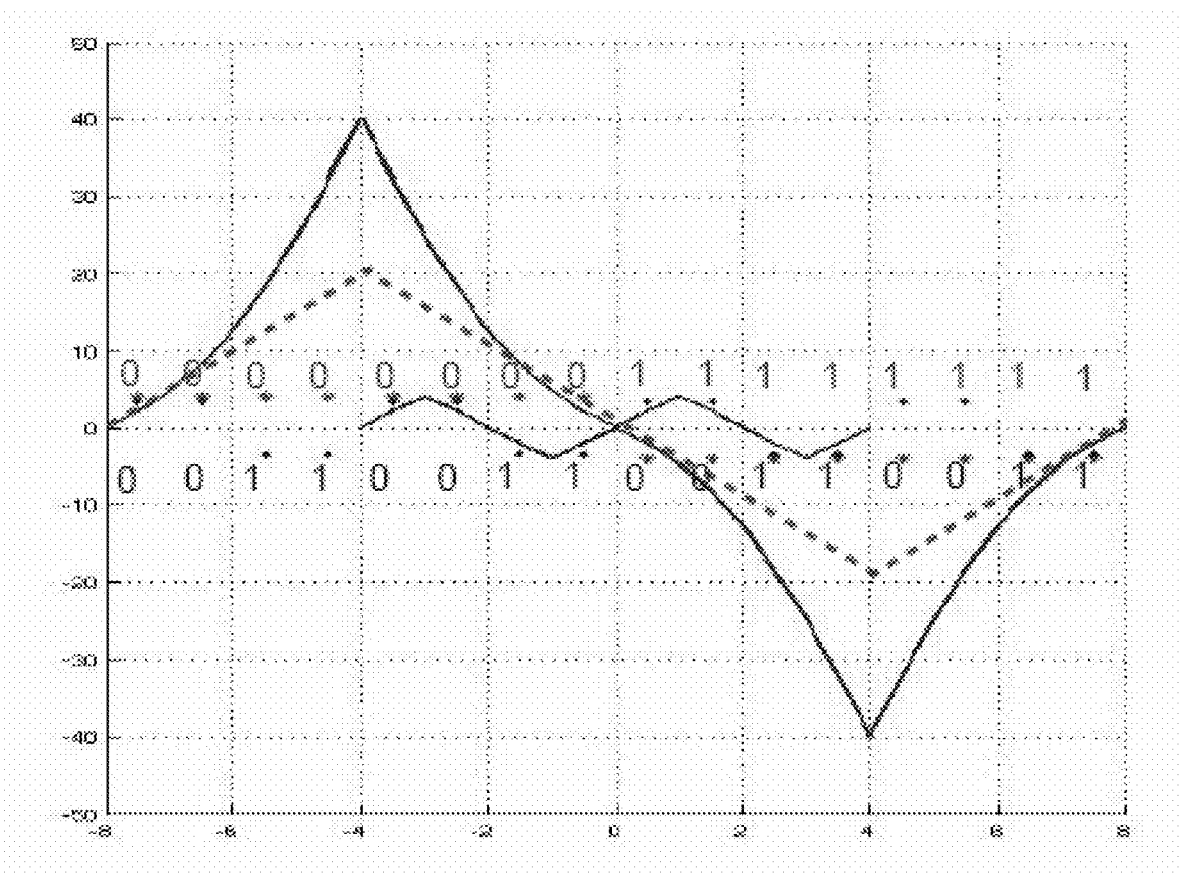
FIG. 9 illustrates exemplary LLR plots for a Coset bit and a Superset bit of the 256SQ constellation modulation illustrated in FIG. 8.

FIG. 9 illustrates exemplary LLR plots for a Coset bit and a Superset bit of the 256SQ constellation modulation illustrated in FIG. 8. The log-likelihood function used for plotting all points can be represented as:

$$LLR_{b_i}(x) = \ln\left(\frac{p_{b_i=0} \mid x}{p_{b_i=1} \mid x}\right)$$

Therefore, for the Coset bit ($b_i$) where the bit changes for every two consecutive points, the corresponding LLR can be represented as:

$$LLR_b(x) =$$

$$\ln\left(\frac{\frac{1}{\sigma\sqrt{2\pi}}\left(e^{-\left(\frac{x-\frac{\mu}{2}}{\sigma\sqrt{2}}\right)^2} + e^{-\left(\frac{x-\frac{3\mu}{2}}{\sigma\sqrt{2}}\right)^2} + e^{-\left(\frac{x+\frac{5\mu}{2}}{\sigma\sqrt{2}}\right)^2} + e^{-\left(\frac{x+\frac{7\mu}{2}}{\sigma\sqrt{2}}\right)^2} + \ldots\right)}{\frac{1}{\sigma\sqrt{2\pi}}\left(e^{-\left(\frac{x+\frac{\mu}{2}}{\sigma\sqrt{2}}\right)^2} + e^{-\left(\frac{x+\frac{3\mu}{2}}{\sigma\sqrt{2}}\right)^2} + e^{-\left(\frac{x-\frac{5\mu}{2}}{\sigma\sqrt{2}}\right)^2} + e^{-\left(\frac{x-\frac{7\mu}{2}}{\sigma\sqrt{2}}\right)^2} + \ldots\right)}\right)$$

Where $\mu$ is the hamming distance between points in the constellation and $\sigma$ is the sigma of noise for each point. As can be seen from FIG. 9, the LLR function for the Coset bit is a sawtooth function, which is similar to the existing 10GBASE-T 128DSQ (after constellation rotation), except that the hamming distance between each point is 3 dB less. Thus, the LLR for the Coset bit can be approximated by:

$$LLR_b(x) = \frac{\mu}{2\sigma^2} \begin{cases} x & 0 \leq x < 1 \\ 2-x & 1 \leq x < 3 \\ x-4 & 3 \leq x < 4 \end{cases}$$

Where the sigma is the original sigma defined for the rotated 128DSQ constellation in the existing LDPC design for standard 10GBASE-T.

For the Superset bit (Bi) where the bit changes for every 8 consecutive points, the corresponding LLR may be presented as follows:

$$LLR_B(x) = \ln \frac{\frac{1}{\sigma\sqrt{2\pi}}\left(e^{-\left(\frac{x+\frac{\mu}{2}}{\sigma\sqrt{2}}\right)^2} + e^{-\left(\frac{x+\frac{3\mu}{2}}{\sigma\sqrt{2}}\right)^2} + e^{-\left(\frac{x+\frac{5\mu}{2}}{\sigma\sqrt{2}}\right)^2} + e^{-\left(\frac{x+\frac{7\mu}{2}}{\sigma\sqrt{2}}\right)^2} + e^{-\left(\frac{x-\frac{9\mu}{2}}{\sigma\sqrt{2}}\right)^2} + e^{-\left(\frac{x-\frac{11\mu}{2}}{\sigma\sqrt{2}}\right)^2} + e^{-\left(\frac{x-\frac{13\mu}{2}}{\sigma\sqrt{2}}\right)^2} + e^{-\left(\frac{x-\frac{15\mu}{2}}{\sigma\sqrt{2}}\right)^2} + \ldots\right)}{\frac{1}{\sigma\sqrt{2\pi}}\left(e^{-\left(\frac{x-\frac{\mu}{2}}{\sigma\sqrt{2}}\right)^2} + e^{-\left(\frac{x-\frac{3\mu}{2}}{\sigma\sqrt{2}}\right)^2} + e^{-\left(\frac{x-\frac{5\mu}{2}}{\sigma\sqrt{2}}\right)^2} + e^{-\left(\frac{x-\frac{7\mu}{2}}{\sigma\sqrt{2}}\right)^2} + e^{-\left(\frac{x-\frac{9\mu}{2}}{\sigma\sqrt{2}}\right)^2} + e^{-\left(\frac{x-\frac{11\mu}{2}}{\sigma\sqrt{2}}\right)^2} + e^{-\left(\frac{x-\frac{13\mu}{2}}{\sigma\sqrt{2}}\right)^2} + e^{-\left(\frac{x-\frac{15\mu}{2}}{\sigma\sqrt{2}}\right)^2} + \ldots\right)}$$

Again, while the curve for this LLR is not a simple sawtooth function like the Coset bits' LRRs, the LLR function can be approximated with straight lines without sacrificing much of the LDPC performance. As such, we can effectively use a similar or the same LLR logic as for the Coset bit for the Superset bit. The following function represents the approximation:

$$LLR_B(x) = \left(-k \cdot \frac{\mu^2}{2\sigma^2}\right) \begin{cases} x & 00 \leq x < 04 \\ 8-x & 04 \leq x < 12 \\ x-16 & 12 \leq x < 16 \end{cases}$$

Note that the factor k is an adjustment factor that is adjustable in the LLR logic hardware in order to optimize for better transmission performance. In one embodiment, the value range of k is from 1~2.

Alternatively, the amplitudes in each axis may be divided by a factor of 4 (e.g., by right shifting 2 bits), and the same LLR function as that for the Coset LLR can be used. Considering the divided-by-four change in µ and σ, a new LLR equation for the Superset bit can be represented as:

$$LLR_B(x) = \left(-k \cdot \frac{2\mu^2}{\sigma^2}\right) \begin{cases} x & 0 \leq x < 1 \\ 2-x & 1 \leq x < 3 \\ x-4 & 3 \leq x < 4 \end{cases}$$

Because each Coset or Superset has four bits, the LLR functions for each of the bits can be obtained by applying offsets to the LLR variables, which is similar to the existing LLR calculation for the standard 10GBASE-T. For a Coset bit, an exemplary LLR input variable conversions is provided as follows:

$x_0 = (x+0.5)$ modulo 4

$x_1 = (x+1.5)$ modulo 4

$y_0 = (y+0.5)$ modulo 4

$y_1 = (y+1.5)$ modulo 4

Where x and y respectively are the amplitudes for the horizontal and vertical axes associated with the two PAM-16 symbols in 256SQ as shown in FIG. 8.

Similarly, for the Superset bits, the LLR calculations can be represented as:

$$X_0 = \frac{(x+0.5)}{4} \text{modulo } 4$$

$$X_1 = \frac{(x+4.5)}{4} \text{modulo } 4$$

$$Y_0 = \frac{(y+0.5)}{4} \text{modulo } 4$$

$$Y_1 = \frac{(y+4.5)}{4} \text{modulo } 4$$

In accordance with some embodiments, to further increase the coding gain of the Superset bits in the LDC, the decoded Coset bit values after LDPC can be used in calculating the LLRs for the Superset bits. In this way, the Coset values can help to improve the coding gain by applying offsets that are a function of the decoded Coset points, rather than fixed offsets, to the LLR input variables. In these embodiments, the LLR calculations can be represented as:

$$X_0 = \frac{(x+Xoffset)}{4} \text{modulo } 4$$

$$X_1 = \frac{(x+Xoffset+4)}{4} \text{modulo } 4$$

$$Y_0 = \frac{(y+Yoffset)}{4} \text{modulo } 4$$

$$Y_1 = \frac{(y+Yoffset)+4}{4} \text{modulo } 4$$

And the offsets can be represented as:

$$Xoffset = \begin{cases} \frac{3}{2} & b_3 b_2 = 00 \\ \frac{1}{2} & b_3 b_2 = 01 \\ -\frac{1}{2} & b_3 b_2 = 11 \\ -\frac{3}{2} & b_3 b_2 = 10 \end{cases}$$

$$Yoffset = \begin{cases} \frac{3}{2} & b_1 b_0 = 00 \\ \frac{1}{2} & b_1 b_0 = 01 \\ -\frac{1}{2} & b_1 b_0 = 11 \\ -\frac{3}{2} & b_1 b_0 = 10 \end{cases}$$

Note that the SNR improvement using the above offset values is not always needed in practice the embodiments of the 256SQ constellation as the Superset bits already have higher SNR margin than Coset bits.

Figure 10:
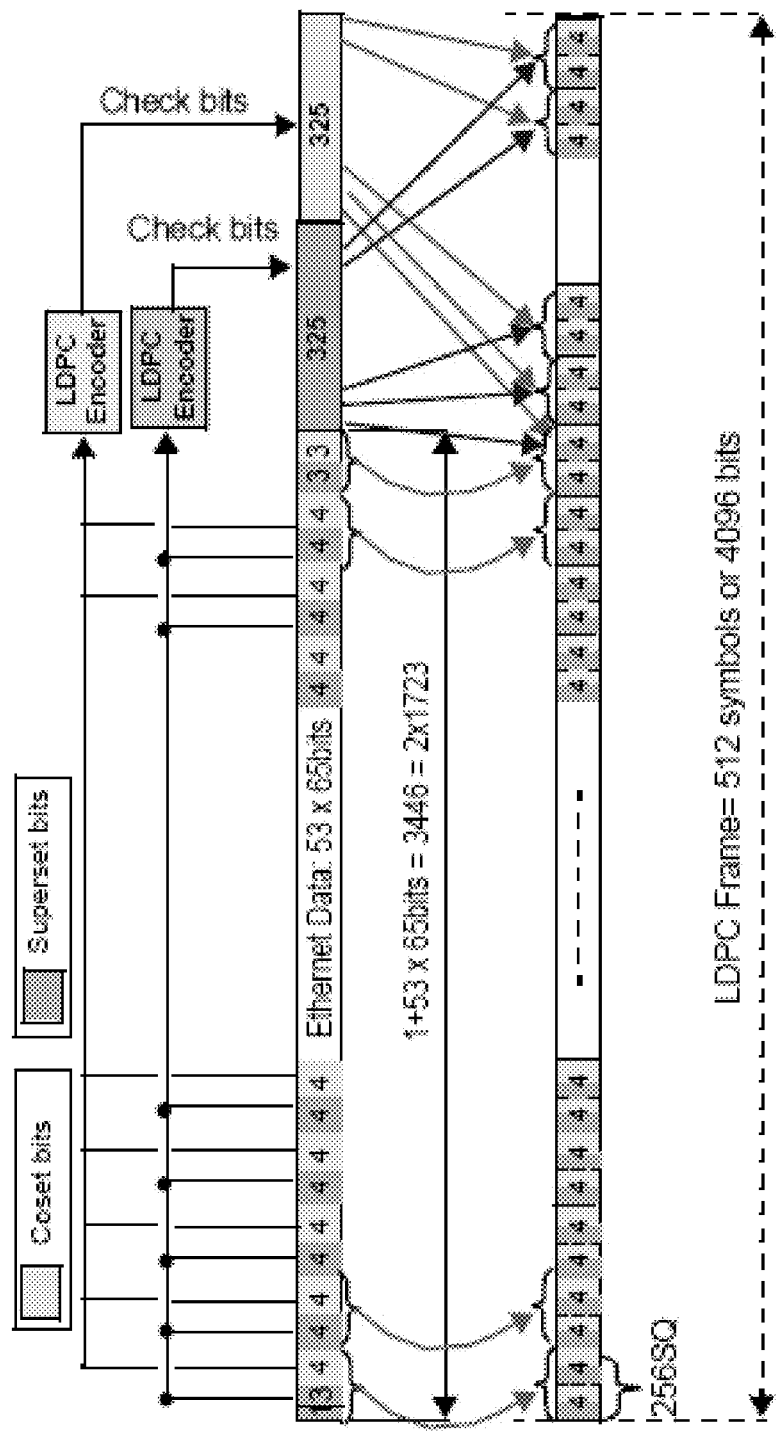
FIG. 10 illustrates an exemplary grouping of 53×65-bit Ethernet data and the associated LDPC parity bits into 512 256SQ symbols.

FIG. 10 illustrates an exemplary grouping of 53×65-bit Ethernet data and the associated LDPC parity bits into 512 256SQ symbols, where each 256SQ symbol (or a pair of PAM-16 symbols) includes 8 data bits. One of the many advantages of the 256SQ constellation illustrated in FIG. 8, together with the interleaved LDPC architecture illustrated in FIG. 10, is that the two coded words (e.g., the Coset bits and Superset bits) can be decoded simultaneously with merely half an iteration cycle delay between them. As such, as soon as the LDPC frames for the Coset and Superset is completed, the coding process for the two sets can start simultaneously.

Neo-128DSQ Modulation

Figure 11:
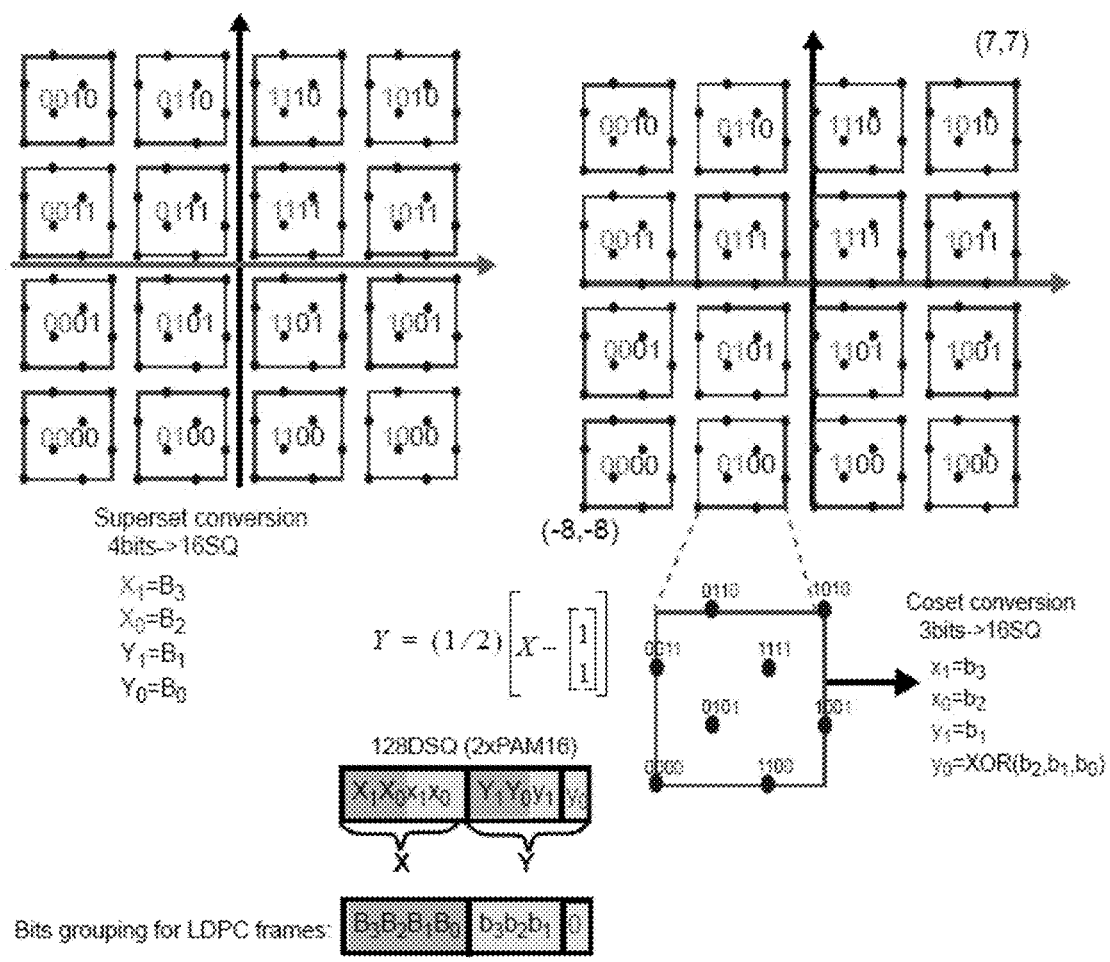
FIG. 11 illustrates an exemplary Neo-128DSQ constellation and its LDPC encode/decode grouping.

FIG. 11 illustrates an exemplary Neo-128DSQ constellation and its LDPC encode/decode grouping. The Neo-128DSQ constellation, similar to the standard 128DSQ constellation, is an example of a modulation scheme that represents a data bit per symbol value of 3.5. According to some embodiments, the standard 10GBASE-T 128DSQ modulation can be modified to adopt a different constellation and grouping of Cosets. The Neo-128DSQ modifies the standard 128DSQ constellation so that it may include 16 subsets of 8DSQ points (16 Cosets) and one set of 16SQ subsets (Superset). The hamming distance between each 8DSQ subset points (illustrated in FIG. 11 as the points inside the squares) is 3 dB larger than the abovementioned 1D PAM-16 or 256SQ schemes. Each point of the 16 points in the 16SQ Superset is one of the 16 Cosets, and therefore, if the slicing uses the Coset decoded bits to identify the correct location within the Coset, the hamming distance between each Superset point is 12 dB higher than that of the Coset points. Without information from coded bits, the hamming distance for the Superset points is same as the Coset points.

In one embodiment of the Neo-128DSQ scheme, considering the possible high return loss (RL) in inferior installations (e.g., CAT5e cables) at above 100 MHz and high sensitivity of uncoded bits due to bad channel RL, the 16SQ Superset bits are also coded and protected by LDPC. Optionally, decoded Coset bit information can still be used in calculating Log Likelihood Ratios (LLRs) for the Superset bits before LDPC decoder, which may provide around 12 dB of additional SNR margin. Nonetheless, while causing more latency to the transmission data path, experimental data have shown that the additional SNR gain may not be as beneficial as expected because the limitation on the Coset bits' SNR margin. Therefore, in a preferred embodiment, the LLRs for Coset bits and Superset bits are calculated separately. One of the many advantages of the Neo-128DSQ constellation is that the LLR values for each Coset bit or Superset bit is only dependent on one axis (e.g., the x-axis or the y-axis), thereby simplifying the LLR calculations.

Parity generation for the 3-bit Cosets may be done by stuffing a zero as LSB for each Neo-128DSQ symbol to make the Cosets become 4-bit wide, and then the LDPC encoding can be performed. On the receiver side, decoding can be done in the same way for the 4-bit Supersets as discussed above for the 256SQ. For the Cosets, only 3 LLRs are generated for 3 MSB bits, and the fourth bit is set to zero (or a maximum LLR value).

Figure 12:
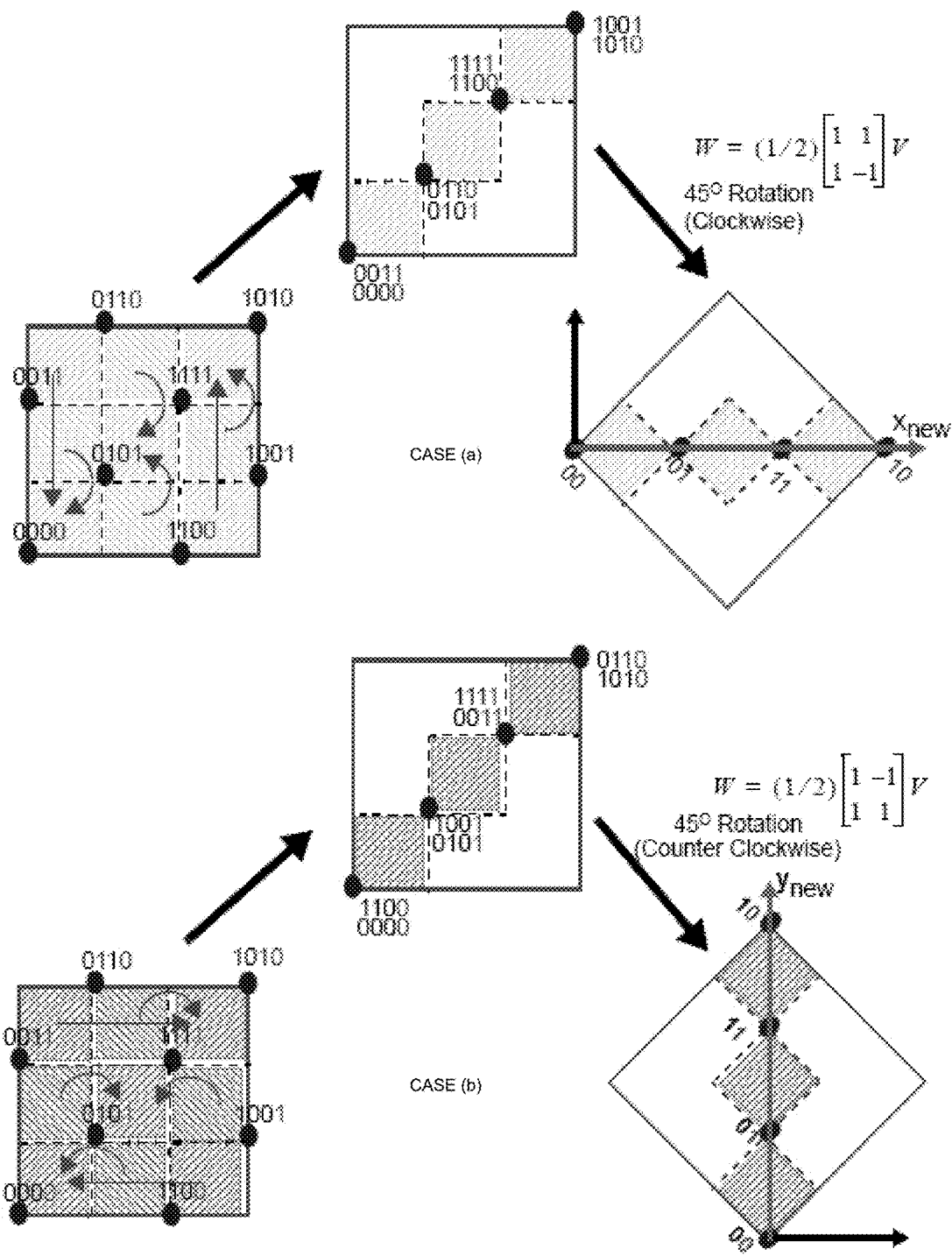
FIG. 12 illustrates exemplary 4-bit Coset transformations to improve SNR for LLR calculation for the Neo-128DSQ constellation of FIG. 11.

To take advantage of the 3 dB increased distance between the constellation points within every Coset during receiving, some embodiments perform transformations for each dimension of the 8DSQ Coset separately and use the transformed values of $x_{new}$ and $y_{new}$ for LLR calculations. Examples of such transformations are shown in FIG. 12. As illustrated in FIG. 12, 4-bit Coset transformations are performed to improve SNR margin for LLR calculations by 3 dB before being processed by the LDPC decoder. In FIG. 12, case (a) is transforming for an X dimension to find new $X_{new}$ values, and case (b) is transforming for a Y dimension for find new $Y_{new}$ values.

The signal to noise ratio (SNR) for the Neo-128DSQ scheme is same as that of the original rotated standard 128DSQ and is 3 dB higher than the aforementioned 256SQ or 1D PAM-16 schemes. For the Coset bits, LLR calculations can be approximated using similar LLR equations as the 256SQ ones but with 3 dB higher SNR ($\mu/\sigma$) and with the exception of $b_0$ being forced to set to zero:

$$LLR_{b0}(x) = \frac{\mu^2}{\sigma^2}$$

$$LLR_{bi}(x) = \frac{\mu^2}{\sigma^2}\begin{cases} x & 0 \le x < 1 \\ 2-x & 1 \le x < 3 \\ x-4 & 3 \le x < 4 \end{cases}$$

And the following conversions may be used for the input variables:

$x_0 = (x_{new} + 0.5)$ modulo 4

$x_1 = (x_{new} + 1.5)$ modulo 4

$y_1 = (y_{new} + 1.5)$ modulo 4

Superset LLRs can be treated as the same as those Superset LLRs in the 256SQ scheme, and therefore the LLR function can be represented as:

$$LLR_B(x) = \left(-k \cdot \frac{4\mu^2}{\sigma^2}\right)\begin{cases} x & 0 \le x < 1 \\ 2-x & 1 \le x < 3 \\ x-4 & 3 \le x < 4 \end{cases}$$

Note that the factor k is an adjustment factor that is adjustable in the LLR logic hardware in order to optimize for better transmission performance. In one embodiment, the value range of k is from 1~2.

The offsets for each Superset LLR may be:

$$X_0 = \frac{(x+0.5)}{4} modulo\ 4$$

$$X_1 = \frac{(x+4.5)}{4} modulo\ 4$$

$$Y_0 = \frac{(y+0.5)}{4} modulo\ 4$$

$$Y_1 = \frac{(y+4.5)}{4} modulo\ 4$$

Additionally, in the Neo-128DSQ constellation, instead of the fixed offsets, decoded Coset bit dependent offsets may be used, thereby gaining a 12 dB additional SNR before the LDPC decoder for the Superset bits. An exemplary calculation may be represented as follows:

$$X_{offset} = \begin{cases} \frac{3}{2} & b_3b_2 = 00 \\ \frac{1}{2} & b_3b_2 = 01 \\ -\frac{1}{2} & b_3b_2 = 11 \\ -\frac{3}{2} & b_3b_2 = 10 \end{cases}$$

$$Y_{offset} = \begin{cases} \frac{3}{2} & b_1 = 0 \\ -\frac{1}{2} & b_1 = 1 \end{cases}$$

Note that the SNR improvement using the above offset values is not always needed in practicing the embodiments of the Neo-128DSQ constellation as the Superset bits already have higher SNR margin than Coset bits.

Figure 13:
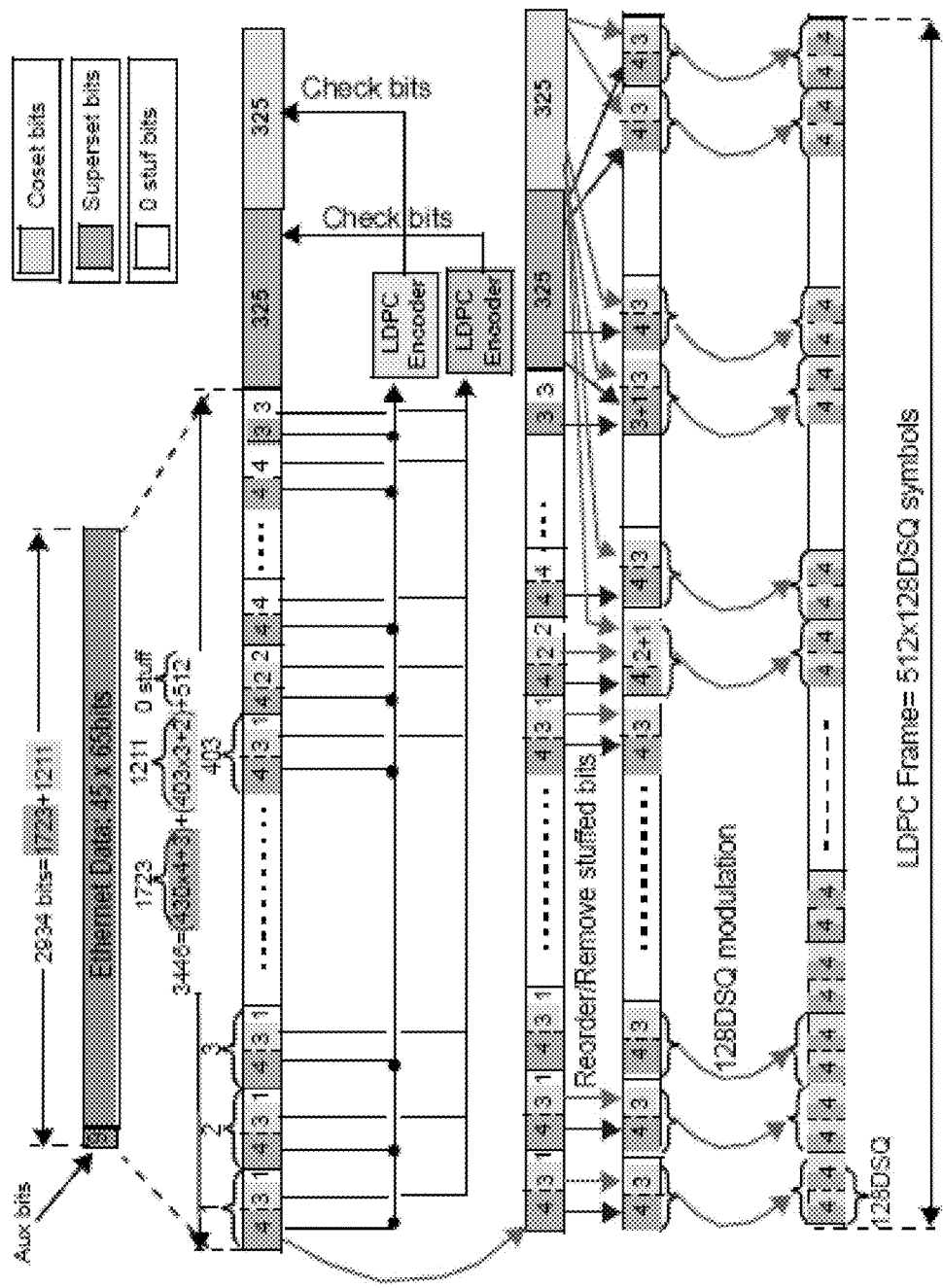
FIG. 13 illustrates an example of Ethernet data bit allocation and LDPC framing as well as the final ordering to build the 7-bit Neo-128DSQ symbols illustrated in FIG. 11.

FIG. 13 illustrates an example of Ethernet data bit allocation and LDPC framing as well as the final ordering to build the 7-bit Neo-128DSQ symbols above described.

Figure 14:
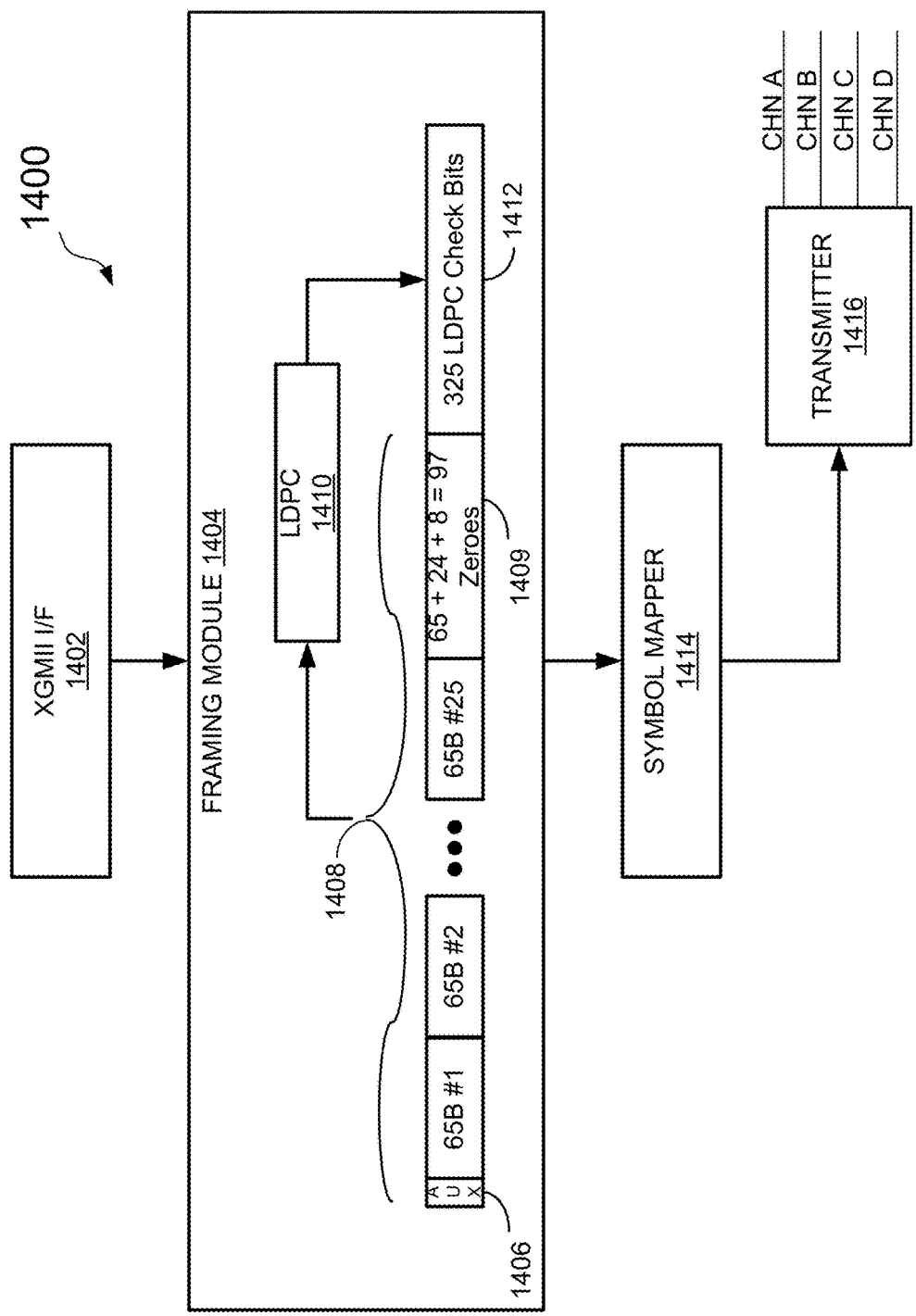
FIG. 14 illustrates a block diagram of a BASE-T transceiver that employs a framing module to carry out Ethernet data bit allocations and LDPC framing similar to previously described embodiments herein.

FIG. 14 illustrates one embodiment of a BASE-T transceiver, generally designated 1400, that employs a framing module to generate a unique transport frame for variable rate Ethernet data transmission. The transport frame allows for resulting data rates that are precise sub-multiples of a full 10 Gbps data rate. For example, data received via Ethernet data blocks from the XGMII interface at a symbol rate of 10 GSym/sec may be rate shifted for transmission across an Ethernet link at rates of, for example, exactly 5.0 Gbps or 2.5 Gbps through use of the transport framing apparatus and methodology described more fully below.

Further referring to FIG. 14, the transceiver 1400 includes a 10 Gigabit Media Independent Interface (XGMII) 1402 that interfaces the transceiver (PHY) to a media access controller (MAC). From a transmit perspective, the interface receives data at a rate of 10 Giga-Symbols per second (10 GSym/s). The XGMII interface then feeds the data to a framing module 1404. The framing module aggregates a certain amount of the data as a payload, at 1408, together with an auxiliary bit 1406 and a number of "predetermined bits", at 1409. The predetermined bits may be pseudorandom bits or additional data payload, depending upon the application. The aggregated information is then forward error encoded via an LDPC encoder 1410, which appends the aggregated information with a series of check bits, at 1412. The resulting generated data structure takes the form of an LDPC transport frame.

With continued reference to FIG. 14, each transport frame generated by the framing module 1404 is mapped into plural symbols by a symbol mapper 1414. The symbols are then transmitted by a transmitter 1416 across plural physical channels CHN A, CHN B, CHN C and CHN D.

Figure 15:
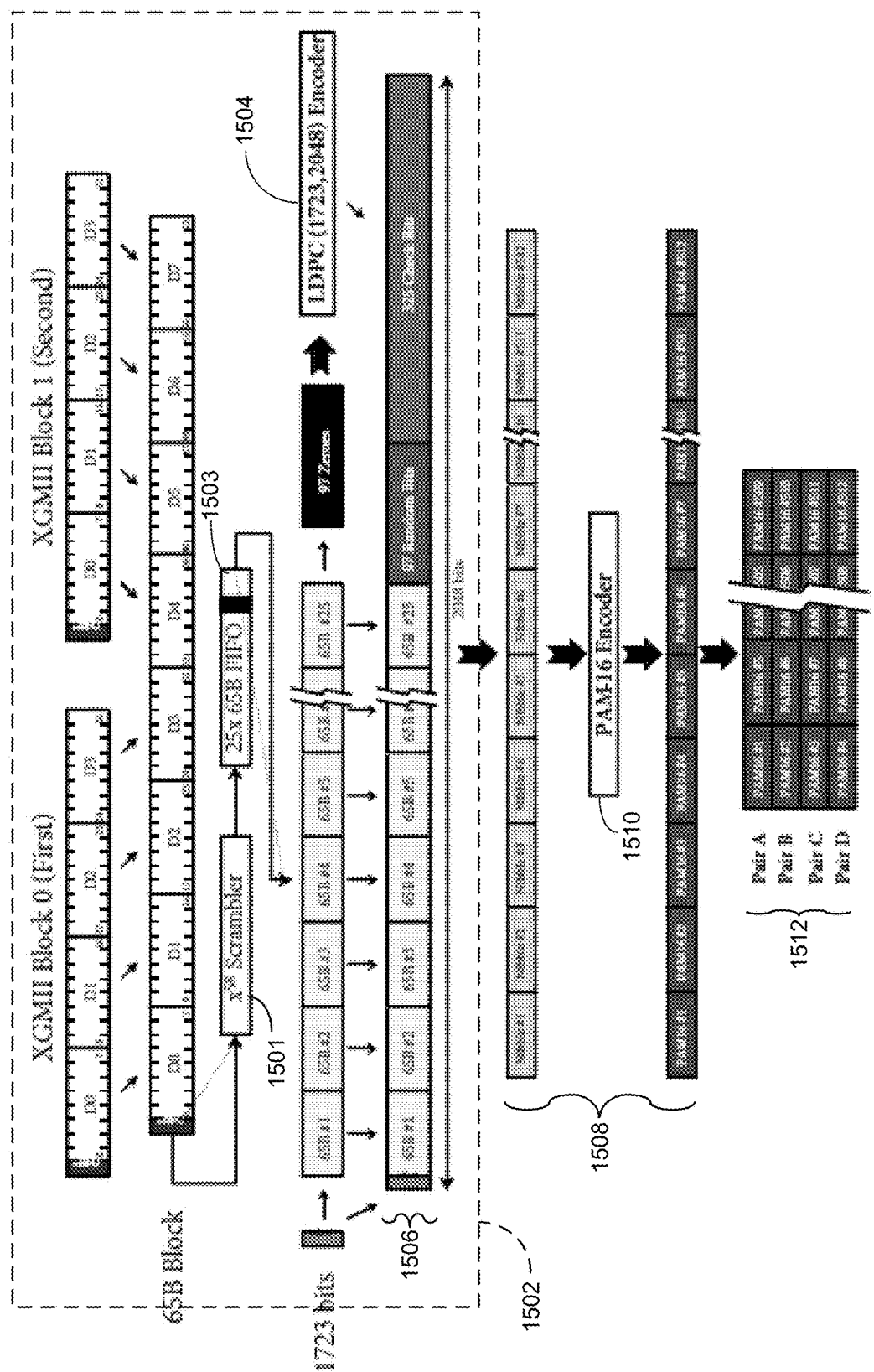
FIG. 15 illustrates further detail of the bit allocations and LDPC framing scheme of FIG. 14 from the transmit side of the transceiver.

FIG. 15 illustrates further detail of the transceiver of FIG. 14, according to one embodiment, from a transmit side perspective. A framing module 1502 receives a specified amount of Ethernet data, such as twenty-five 65-bit blocks, for a total of 1625 data bits. The bits are scrambled by a scrambler 1501, then fed to a 1625 slot first-in first-out (FIFO) circuit 1503. The data bits are then aggregated with an auxiliary bit, 97 predetermined bits, and the aggregated bits encoded via an LDPC encoder 1504. The resulting LDPC transport frame, at 1506, includes the auxiliary bit, with the data payload, the 97 predetermined bits, and 325 check bits, for a total of 2048 bits.

With continued reference to FIG. 15, the 97 predetermined bits contribute an important feature in the transport frame. Since the Ethernet data is received at the interface at a rate of 10 GSym/s, transmitting the data at rates lower than 10 Gbps involve configuring the transport frame in a way to achieve an end data rate suitable for Ethernet link transmissions. Including the 97 predetermined bits, as described above, allows for precise data rate transmissions over an Ethernet link at 5.0 Gbps and 2.5 Gbps when the transmitter transmits at a symbol rate of 400 MSym/s or 200 MSym/s, respectively. While the frame structure is identical for data rates at 5.0 Gbps and 2.5 Gbps, the symbol rates are different, and thus the resulting frame durations for each mode are 320 ns and 640 ns, respectively.

In order to transmit the data in the transport frame, it is mapped by a symbol mapper 1508, into symbols that can be transmitted across the Ethernet link. This involves first organizing the transport frame of 2048 bits into 512 4-bit nibbles, and encoding each nibble by a PAM-16 Gray-Scale encoder 1510. FIG. 17 illustrates one embodiment of a table showing the encoding. As noted above, for some embodiments, the 97 predetermined bits may include pseudorandom data, or be replaced with user-defined data for additional payload. Encoding all of the bits of each nibble provides an advantage in the latency involved in buffering and forming the 2048-bit LDPC frame. This benefit reduces the latency by almost half in comparison to other symbol constellations. FIG. 17 illustrates one embodiment of such an encoder. The resulting 512 symbols are then transmitted by a transmitter across four twisted pair channels, Pair A, Pair B, Pair C, and Pair D, with the first symbol being transmitted across Pair A, the second symbol across Pair B, and so forth.

Figure 16:
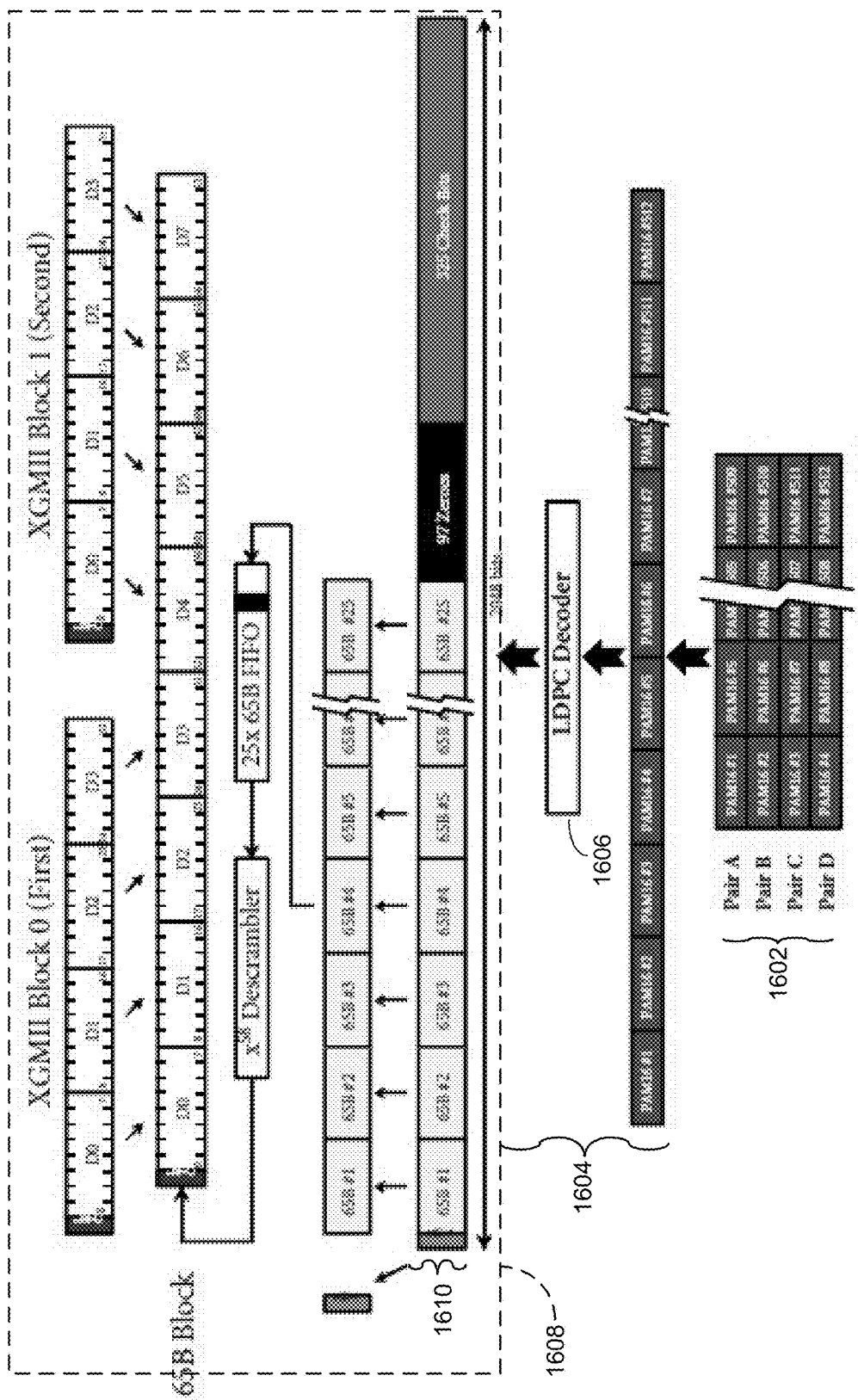
FIG. 16 illustrates further detail of the bit allocations and LDPC framing scheme of FIG. 14 from the receive side of the transceiver.

FIG. 16 illustrates a receive side of the transceiver 1400 of FIG. 14. Much of the receive side of the transceiver includes circuitry that is the inverse of the transmit side. Thus, a receiver receives Gray-Scale encoded PAM 16 Ethernet data from across four twisted-pair channels, Pair A-Pair D. A symbol mapper 1604 then reassembles the received symbols into a sequence of 512 nibbles, where they undergo LDPC decoding by an LDPC decoder 1606.

For one embodiment, prior to undergoing the LDPC decoding, the 97 "predetermined bits" are forced to "zero" values. As zeros, the sequence of 97 bits are thus known bits. Feeding known bits into an LDPC decoder significantly increases a coding gain for the decoder, enabling the decoder to decode the entire frame more quickly and accurately.

Further referring to FIG. 16, the decoded symbols are fed to a framing module 1608, where they form a 2048 bit transport frame 1610, including an auxiliary bit, data payload, 97 zeroes, and 325 check bits. Everything but the data payload is then discarded, and the payload passed into a FIFO, and then descrambled into 65-bit Ethernet data blocks.

As noted above, FIG. 17 illustrates a Gray-Scale coding table, where 4-bit sequences are encoded into a corresponding analog voltage level for PAM 16 transmission. The Gray-coding itself is optimized in an effort to maximize SNR for LLR calculations.

Those having skill in the art will appreciate the many benefits and advantages afforded by the embodiments presented herein. Of significant benefit is the ability to reduce 10GBASE-T data rates without altering the transport frame structure. Further, the wasted throughput associated with unnecessary scaling back of transmission rate is reduced as well as unwanted radiated emissions when performing Ethernet transmission over impaired or inferior physical channels using 10GBASE-T transceivers as disclosed herein. Also, many of the disclosed embodiments enjoy the benefit of higher SNR margin as compared to the standard 10GBASE-T system.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., ' ') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An Ethernet transceiver comprising:
an Ethernet transmit circuit to transmit data organized into a given transport frame structure, the transmit circuit including
a symbol modulator to modulate a first group of symbols in accordance with a selectable data modulation scheme;
a transmitter coupled to the symbol modulator to transmit the first group of symbols over an Ethernet link at a selected symbol rate;
wherein the selected symbol rate and the selected data modulation scheme cooperate to produce a specified data rate from a selection of data rates; and
wherein the data transmitted at each of the selection of data rates utilizes the same transport frame structure.

2. The Ethernet transceiver of claim 1, further comprising:
logic to determine a link quality metric.

3. The Ethernet transceiver of claim 2, wherein:
the logic is operative to identify a type of transmission medium used to transport the data, and the link quality metric is based on the transmission medium.

4. The Ethernet transceiver of claim 2, wherein:
the logic is operative during a training sequence to determine the link quality metric.

5. The Ethernet transceiver of claim 2, wherein:
the logic is operative to determine a signal-to-noise ratio (SNR) as the link quality metric.

6. The Ethernet transceiver of claim 1, wherein:
the specified data rates include a maximum data rate of 10 Gbps.

7. The Ethernet transceiver of claim 6, wherein:
the specified data rates include sub-rates greater than 1 Gbps.

8. The Ethernet transceiver of claim 7, wherein the sub-rates include 2.5 Gbps and 5 Gbps.

9. A method of transferring Ethernet data, the method comprising:
mapping data organized in a transport frame structure into a first group of symbols;
modulating the first group of symbols in accordance with a first selected modulation scheme from a selection of modulation schemes;
transmitting the first group of symbols as first Ethernet data over an Ethernet link at one of a selection of symbol rates;
wherein the selected symbol rate and the selected data modulation scheme cooperate to produce a specified data rate from a selection of data rates; and
wherein the transmitting at each of the selection of data rates utilizes the same transport frame structure.

10. The method of claim 9, wherein the selection of one of the data rates is based on detecting a link quality metric.

11. The method of claim 10, wherein:
the detecting of a link quality metric is carried out as a portion of a link training sequence.

12. The method of claim 10, wherein:
the detecting of a link quality metric is based on a type of transmission medium used to transport the data.

13. The method of claim 10, wherein:
the detecting of a link quality metric is based on measuring a signal-to-noise ratio (SNR).

14. The method of claim 9, wherein:
the default data rate is 10 Gbps, and the selection of data rates include rates greater than 1 Gbps.

15. The method of claim 14, wherein:
the rates greater than 1 Gbps include 2.5 Gbps and 5 Gbps.

16. A method of transferring Ethernet data between link partner transceivers at one of a plurality of data rates above 1 Gbps, the method comprising:
selecting a desired data rate;
transferring the data at the desired data rate in dependence on a predefined pairing of 1) a selected data modulation scheme from plural data modulation schemes, and 2) a selected symbol rate from plural symbol rates; and
wherein transferring of the data involves the same transport frame structure irrespective of the selected data rate.

17. The method of claim 16, wherein:
the selecting of a desired data rate is based on detecting a link quality metric.

18. The method of claim 17, wherein:
the detecting of a link quality metric is carried out as a portion of a link training sequence.

19. The method of claim 17, wherein:
the detecting of a link quality metric is based on a type of transmission medium used to transport the data.

20. The method of claim 17, wherein:
the detecting of a link quality metric is based on measuring a signal-to-noise ratio (SNR).

\* \* \* \* \*